(12) United States Patent
Yang et al.

(10) Patent No.: US 12,489,009 B2
(45) Date of Patent: Dec. 2, 2025

(54) CHIP DISPENSER FOR SELF-ASSEMBLY

(71) Applicant: LG ELECTRONICS INC., Seoul (KR)

(72) Inventors: Inbum Yang, Seoul (KR); Junghun Rho, Seoul (KR); Youngkyu Kim, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 605 days.

(21) Appl. No.: 17/799,111

(22) PCT Filed: Feb. 19, 2020

(86) PCT No.: PCT/KR2020/002379
§ 371 (c)(1),
(2) Date: Aug. 11, 2022

(87) PCT Pub. No.: WO2021/162160
PCT Pub. Date: Aug. 19, 2021

(65) Prior Publication Data
US 2023/0163007 A1 May 25, 2023

(30) Foreign Application Priority Data

Feb. 11, 2020 (KR) .................. 10-2020-0016576

(51) Int. Cl.
*H01L 21/677* (2006.01)
*H10H 20/01* (2025.01)
(Continued)

(52) U.S. Cl.
CPC ....... *H01L 21/67721* (2013.01); *H10H 20/01* (2025.01); *H01L 21/67333* (2013.01);
(Continued)

(58) Field of Classification Search
CPC ........................................... H01L 2224/95101
See application file for complete search history.

(56) References Cited

U.S. PATENT DOCUMENTS 4,081,577 A * 3/1978 Horner .................... B05B 12/06
427/424
5,888,692 A * 3/1999 Voets ................... G03G 9/1131
430/111.3
(Continued)

FOREIGN PATENT DOCUMENTS

JP 2013-70019 A 4/2013
KR 10-2014-0076977 A 6/2014
(Continued)

*Primary Examiner* — Karl Kurple
(74) *Attorney, Agent, or Firm* — Birch, Stewart, Kolasch & Birch, LLP

(57) ABSTRACT

The present invention relates to a method of manufacturing a display device, and more particularly, to a chip dispenser for supplying a micro-LED. The present invention provides a chip dispenser including a body part for accommodating the fluid and the semiconductor light emitting device, and discharging the accommodated fluid and the semiconductor light emitting device, a pressure controller for varying the pressure inside the body; and a stirring part disposed in at least one of the inside and outside of the body, agitating the fluid accommodated in the body and the pressure controller increases the internal pressure of the body part so that the fluid and the semiconductor light emitting device are discharged to the outside in a state in which the agitating part stirs the fluid.

17 Claims, 22 Drawing Sheets

(51) Int. Cl.
    *H01L 21/673* (2006.01)
    *H01L 23/00* (2006.01)
    *H01L 25/075* (2006.01)

(52) U.S. Cl.
    CPC .......... *H01L 24/95* (2013.01); *H01L 25/0753* (2013.01); *H01L 2224/95093* (2013.01); *H01L 2224/95101* (2013.01)

(56) References Cited

U.S. PATENT DOCUMENTS

| | | | | |
|---|---|---|---|---|
| 6,314,638 | B1* | 11/2001 | Kaido | H01M 4/0435 29/730 |
| 9,825,202 | B2 | 11/2017 | Schuele et al. | |
| 12,068,178 | B2* | 8/2024 | Kim | H01L 21/67333 |
| 12,165,890 | B2* | 12/2024 | Park | H01L 24/75 |
| 2005/0229845 | A1* | 10/2005 | Mather | B05B 5/1683 118/308 |
| 2006/0269689 | A1 | 11/2006 | Craig et al. | |
| 2010/0310778 | A1* | 12/2010 | Shioi | B05B 12/122 118/313 |
| 2014/0048494 | A1* | 2/2014 | Simmons, Jr. | C02F 1/725 210/150 |
| 2014/0373778 | A1* | 12/2014 | Fulkerson | B05B 5/1683 118/308 |
| 2017/0133550 | A1* | 5/2017 | Schuele | H10H 20/824 |
| 2018/0026074 | A1 | 1/2018 | Lee et al. | |
| 2018/0029038 | A1* | 2/2018 | Sasaki | H01L 25/0753 |
| 2023/0154769 | A1* | 5/2023 | Kim | H01L 21/67121 406/86 |

FOREIGN PATENT DOCUMENTS

| | | |
|---|---|---|
| KR | 10-1507559 B1 | 3/2015 |
| KR | 10-2018-0011404 A | 2/2018 |

* cited by examiner

[Figure 1]
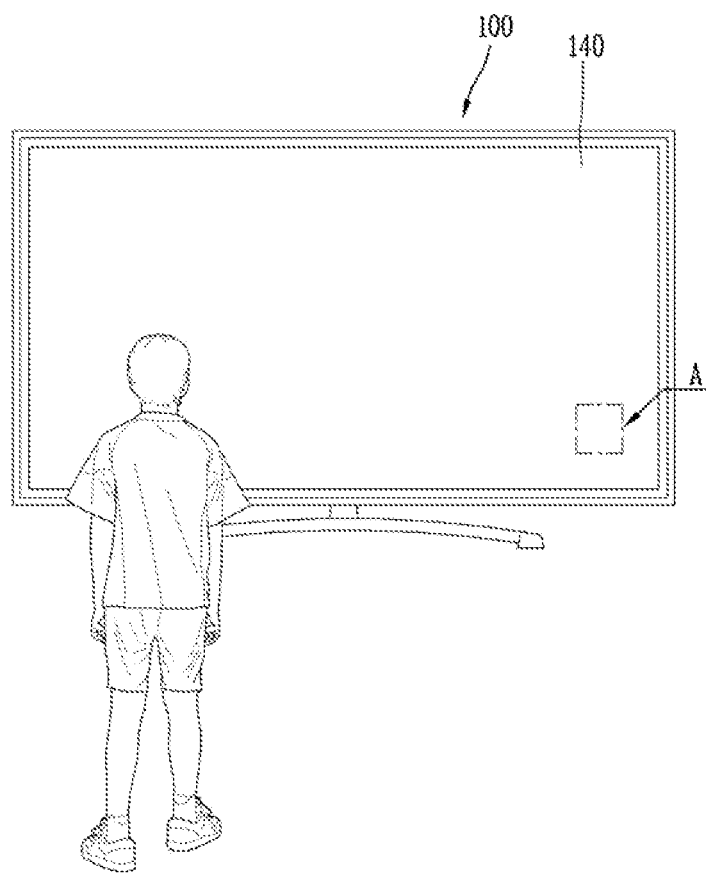

[Figure 2]
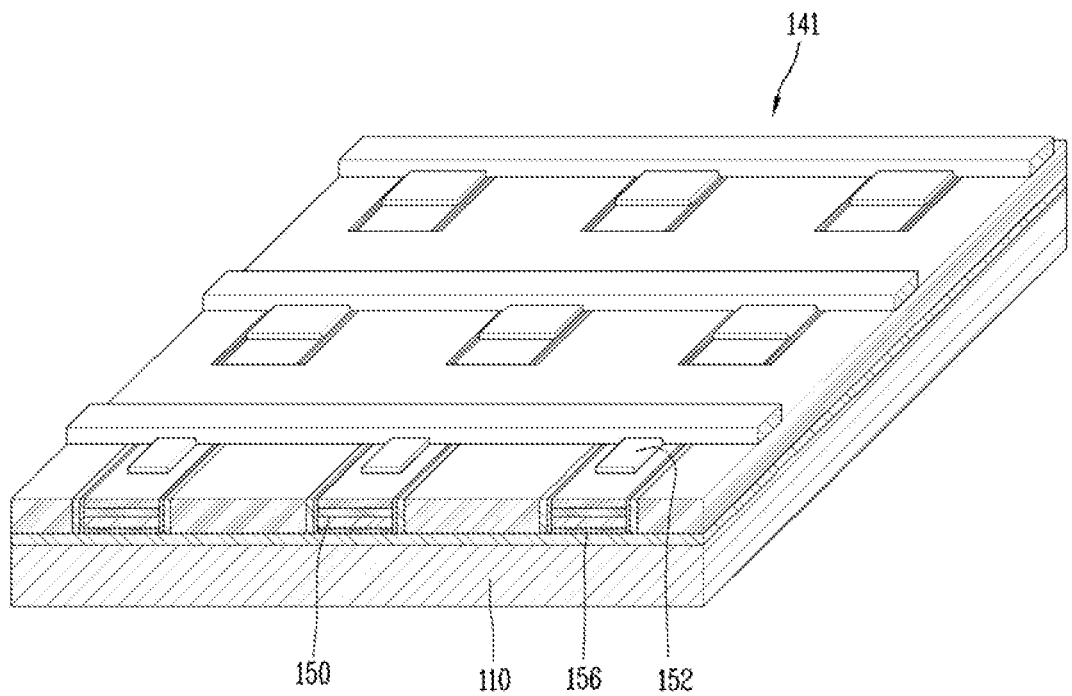
[Figure 3]
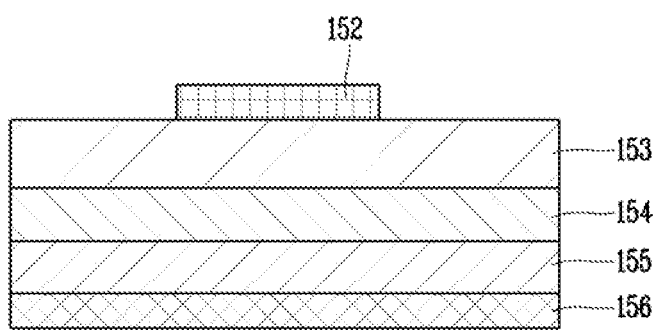

[Figure 4]
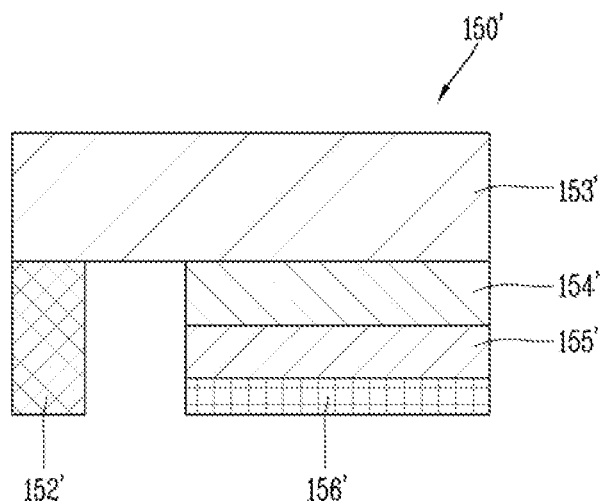
[Figure 5A]
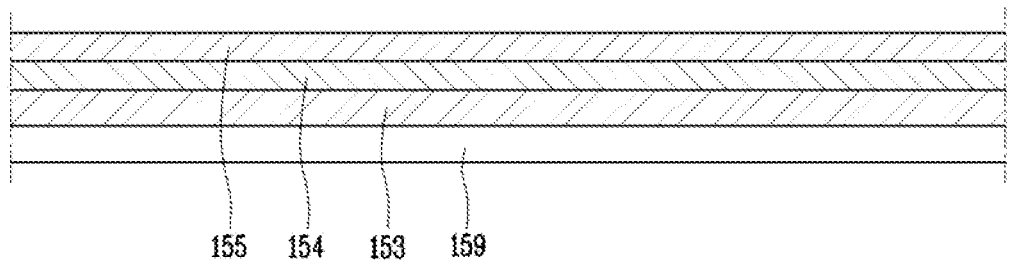
[Figure 5B]
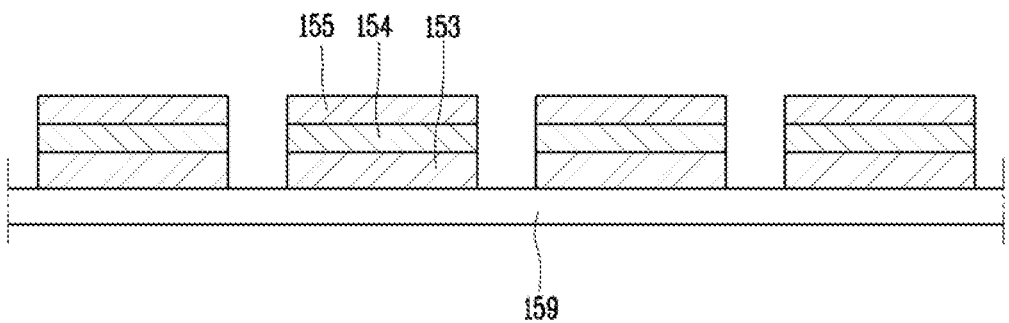

[Figure 5C]
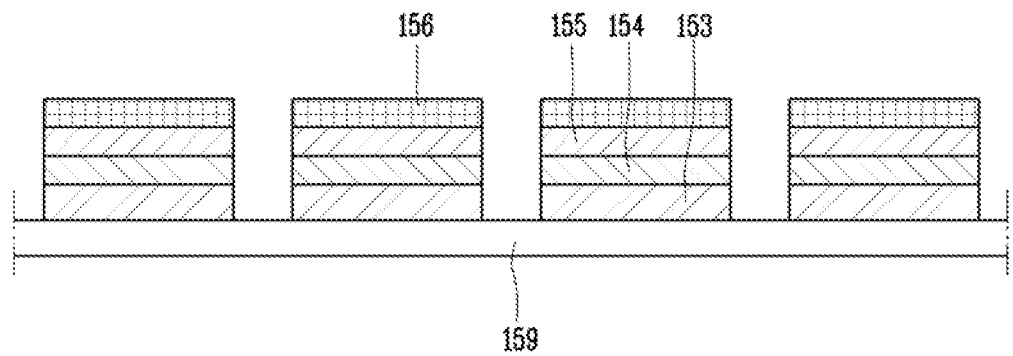
[Figure 5D]
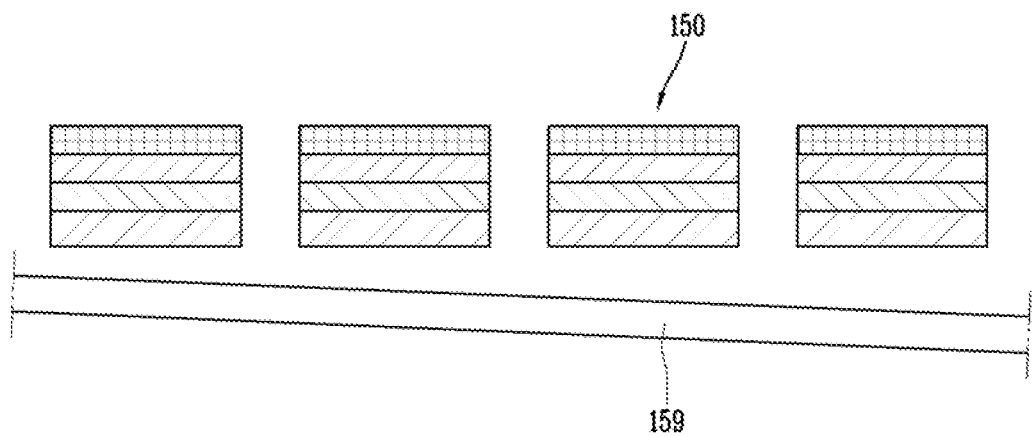
[Figure 5E]
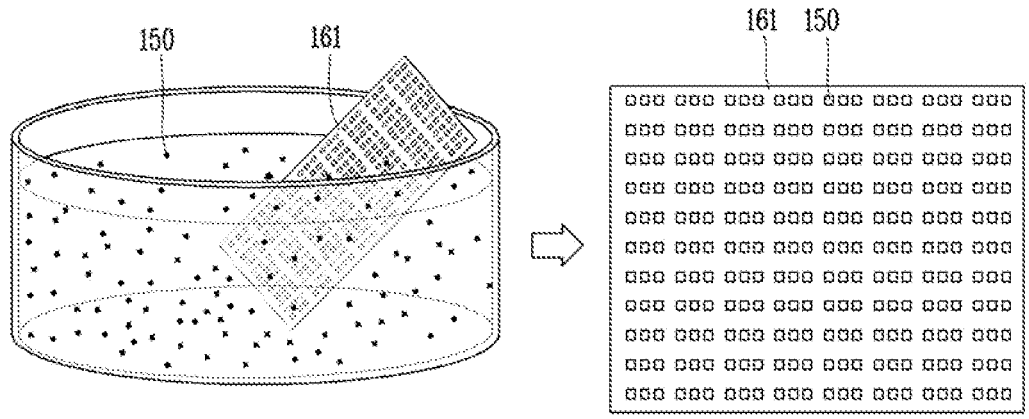

[Figure 6]
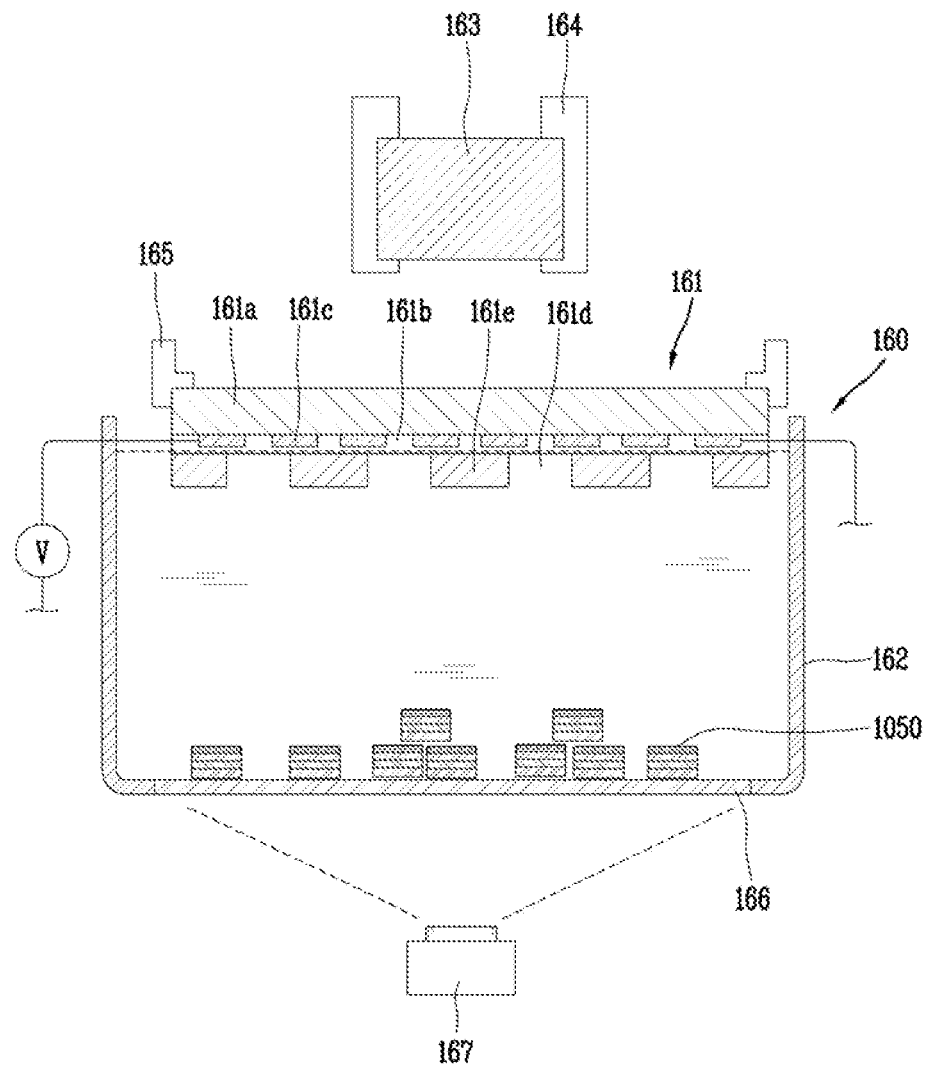

[Figure 7]
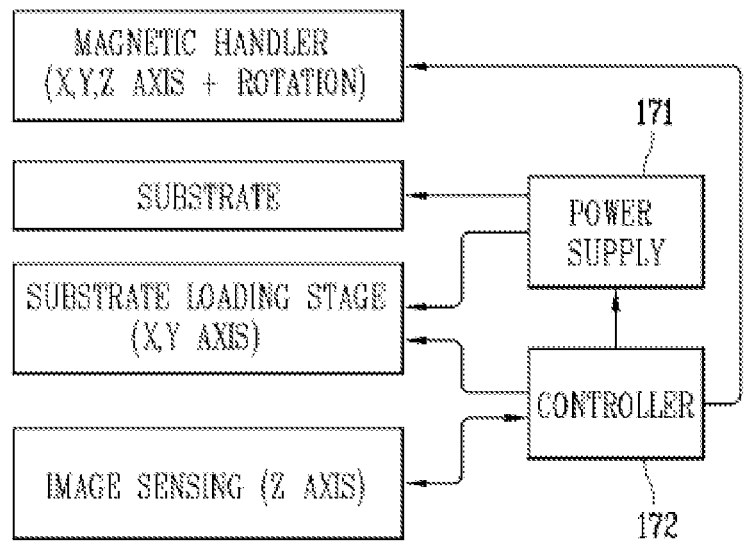
[Figure 8A]
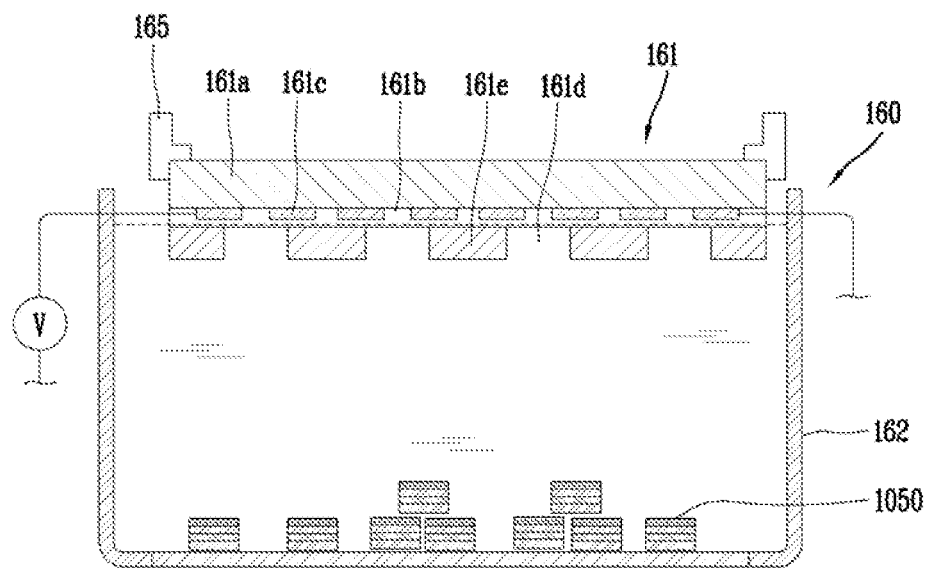

[Figure 8B]
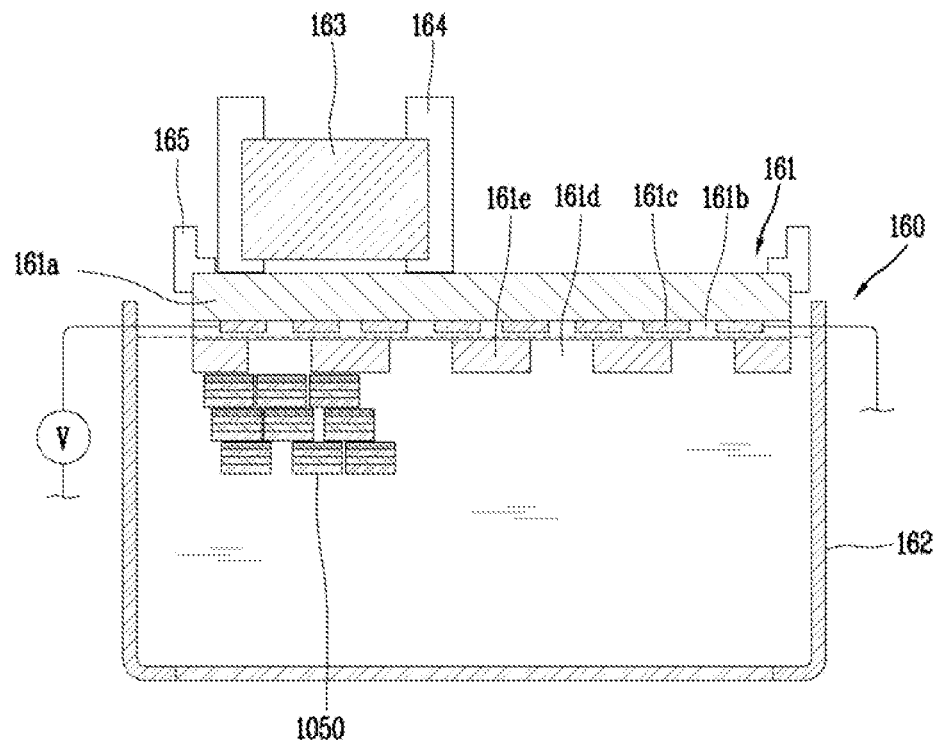
[Figure 8C]
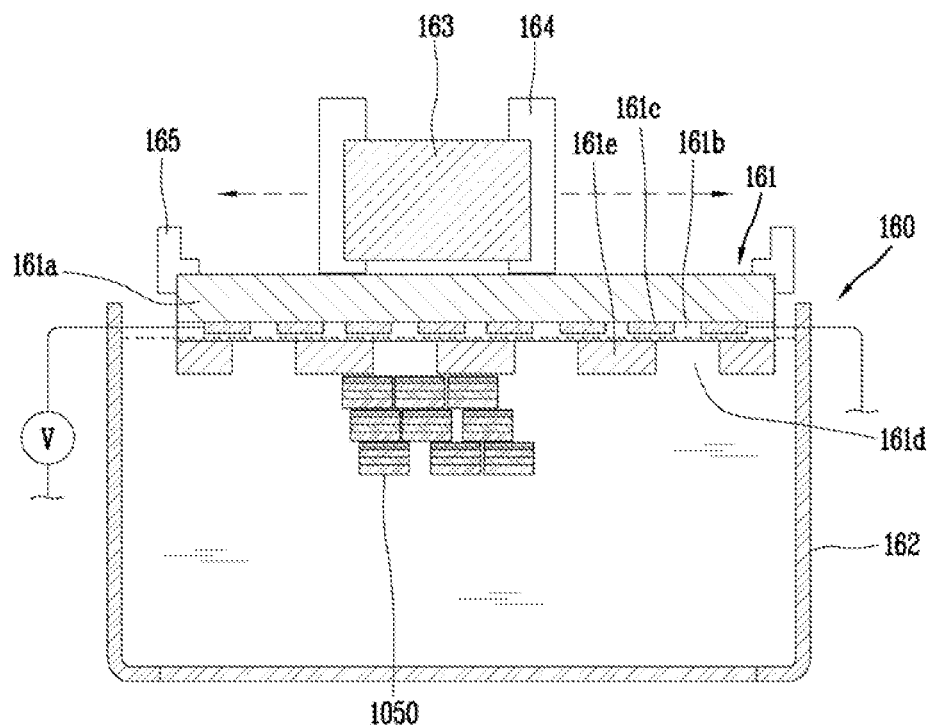

[Figure 8D]
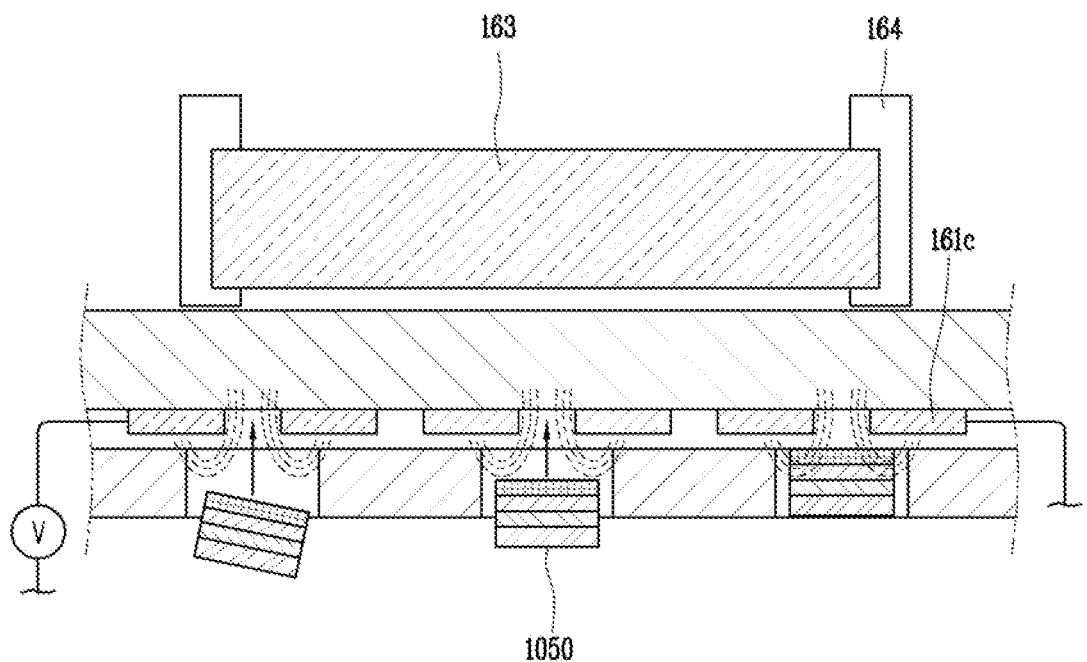
[Figure 8E]
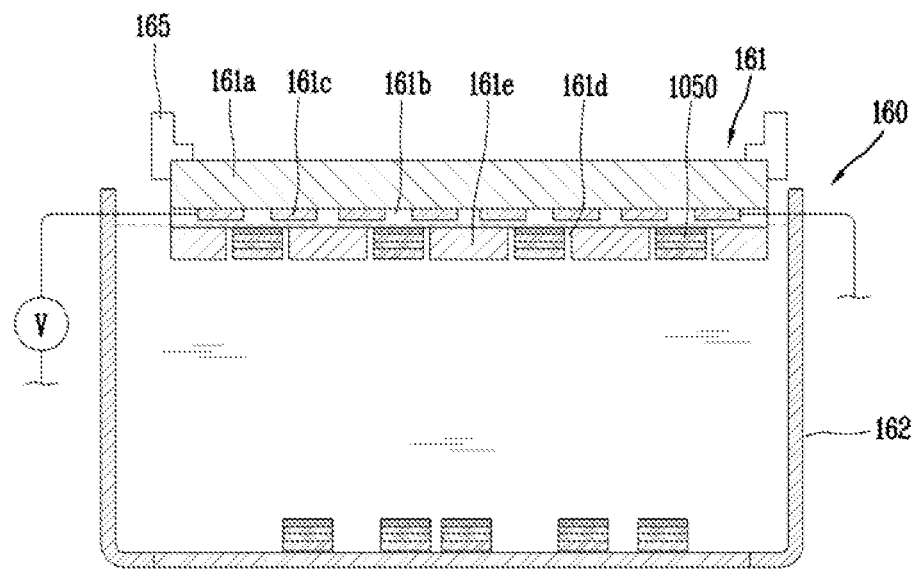

[Figure 9]
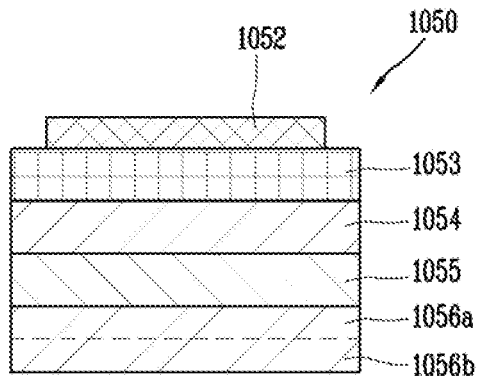
[Figure 10]
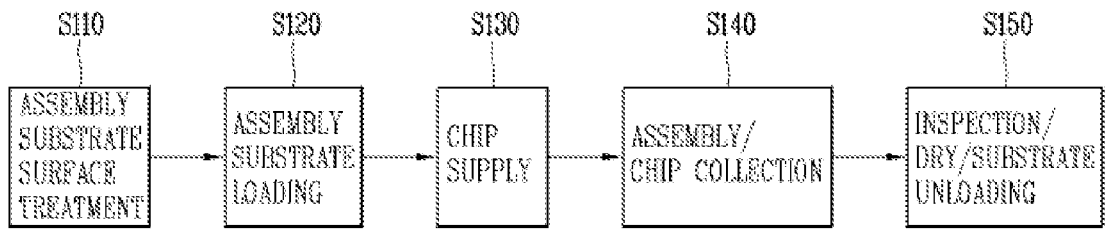
[Figure 11]
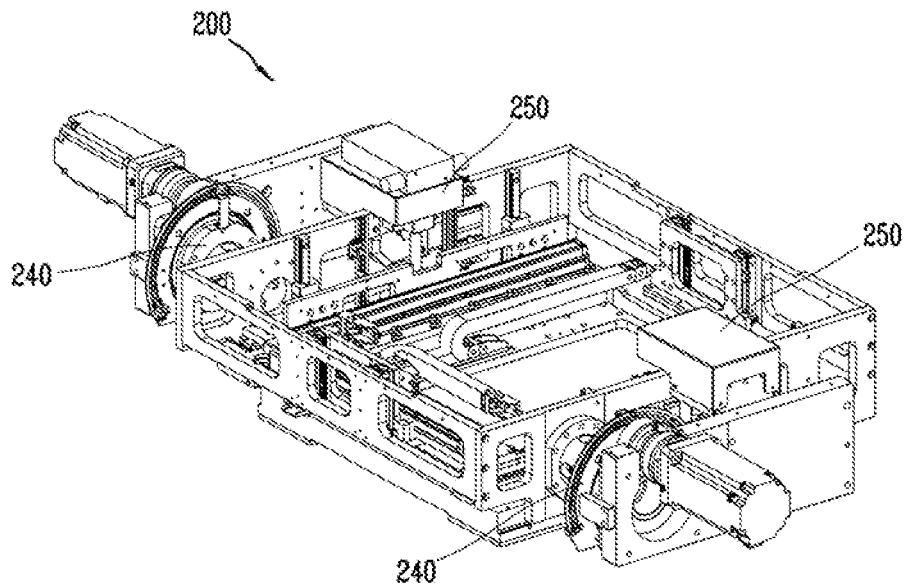

[Figure 12]
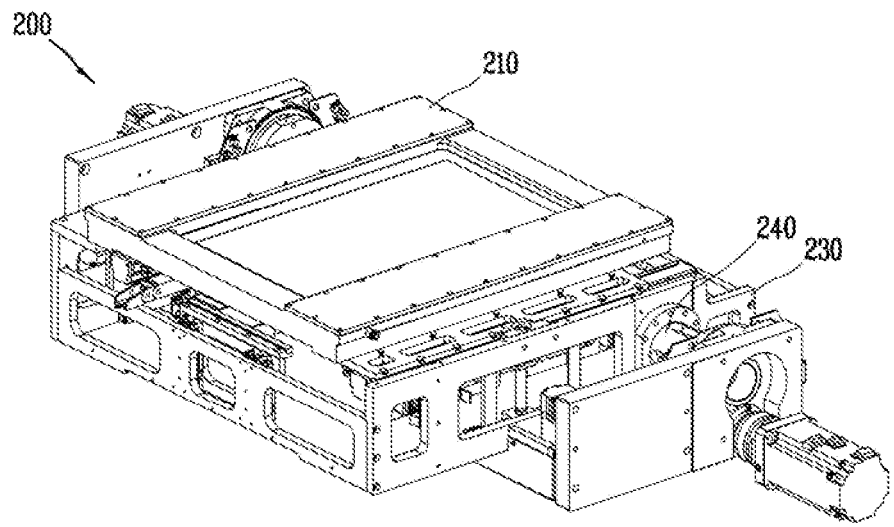
[Figure 13]
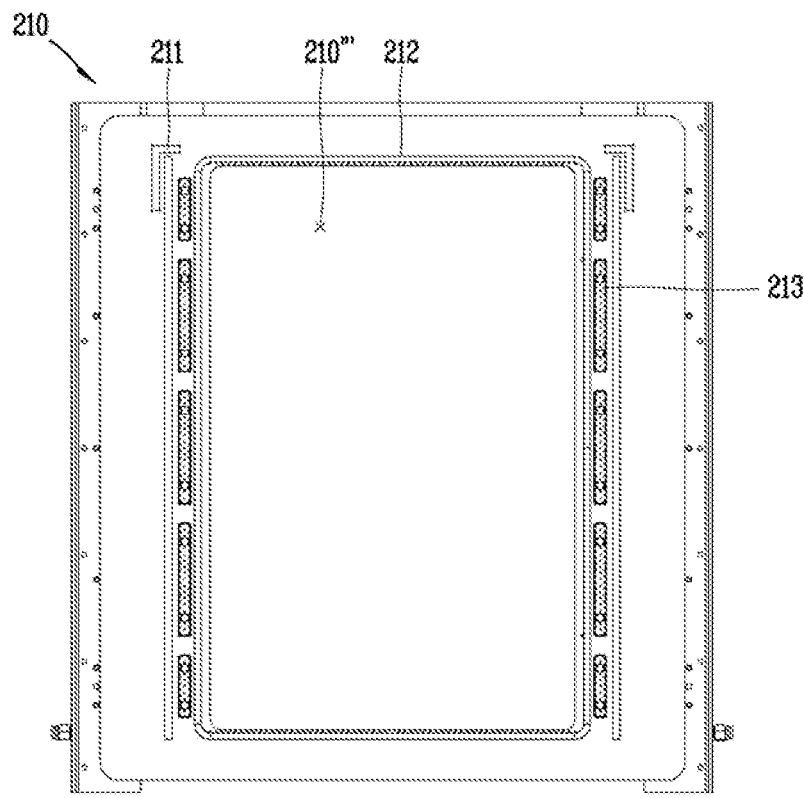

[Figure 14]
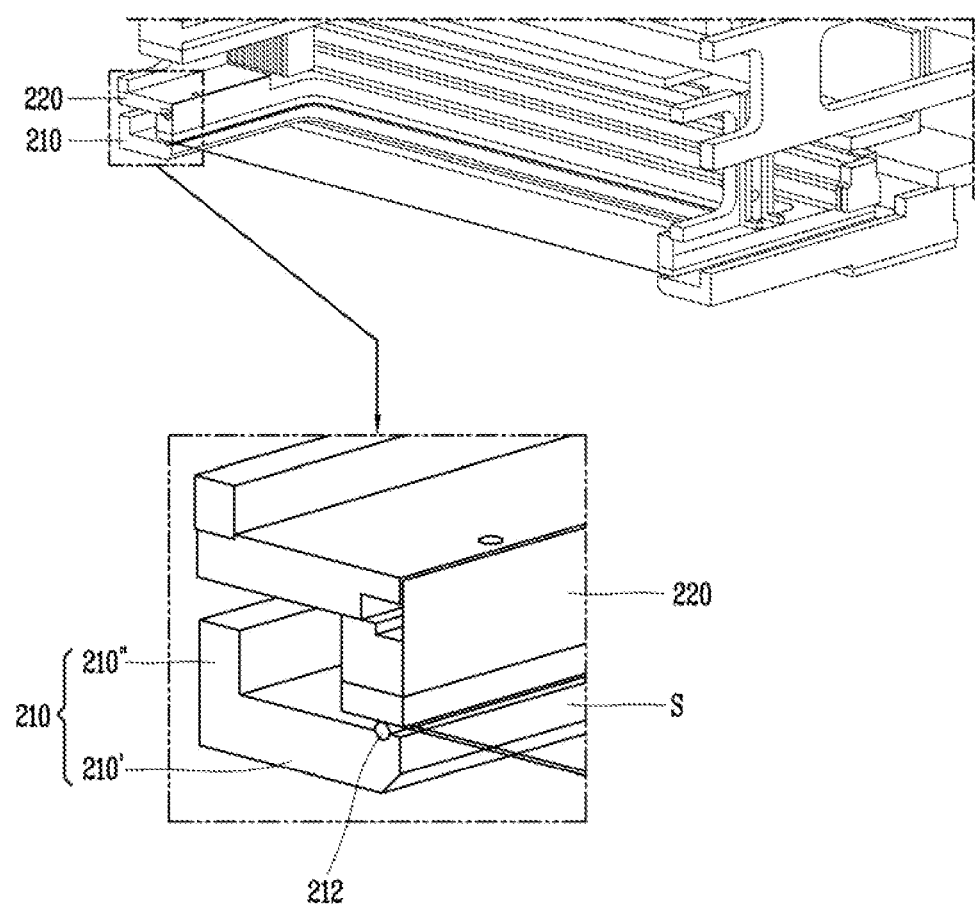

[Figure 15]
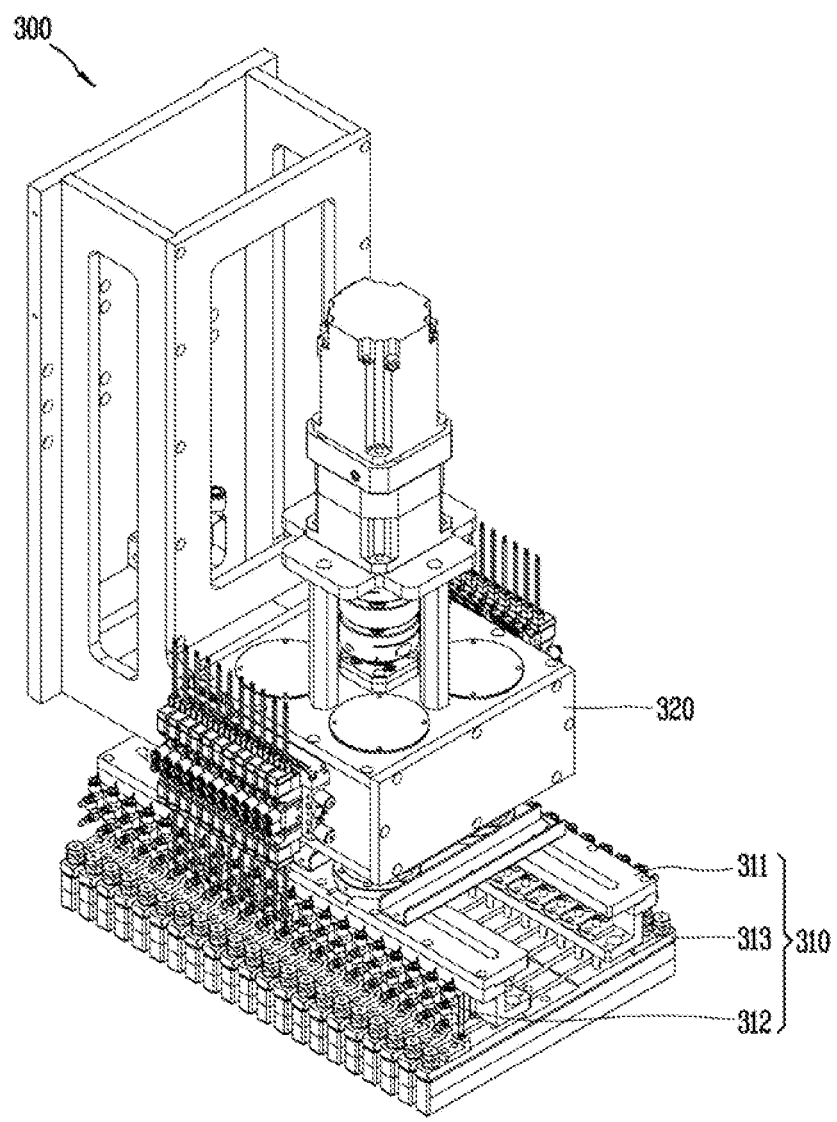

[Figure 16]
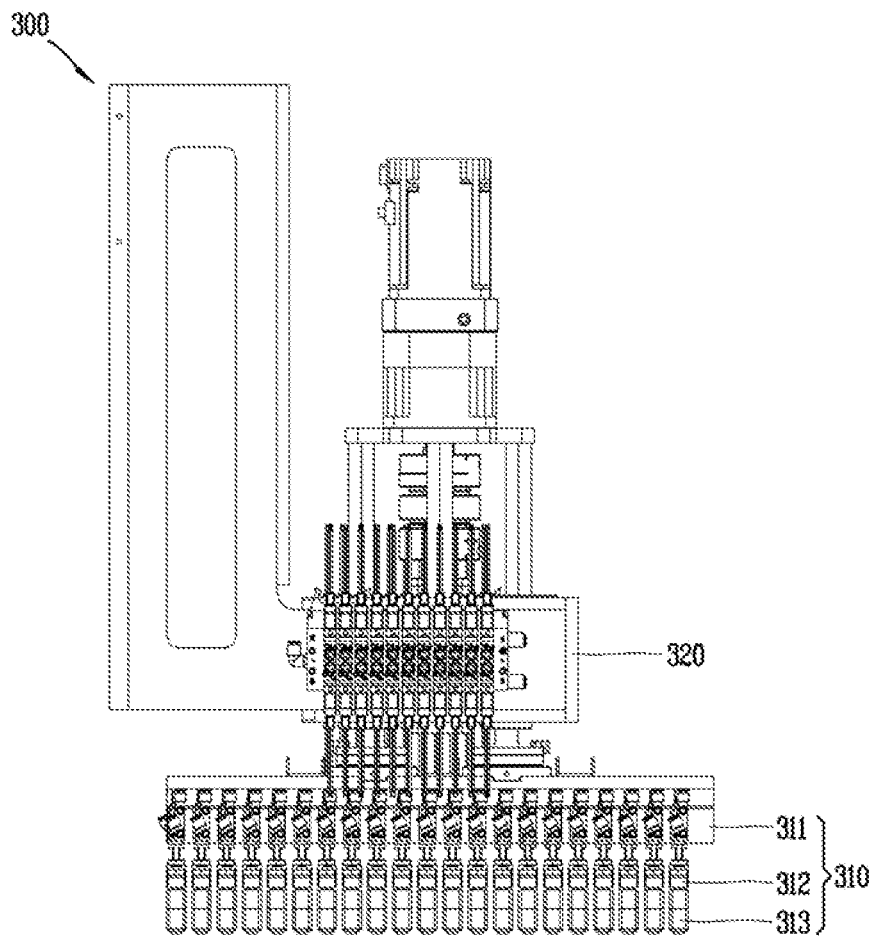
[Figure 17]
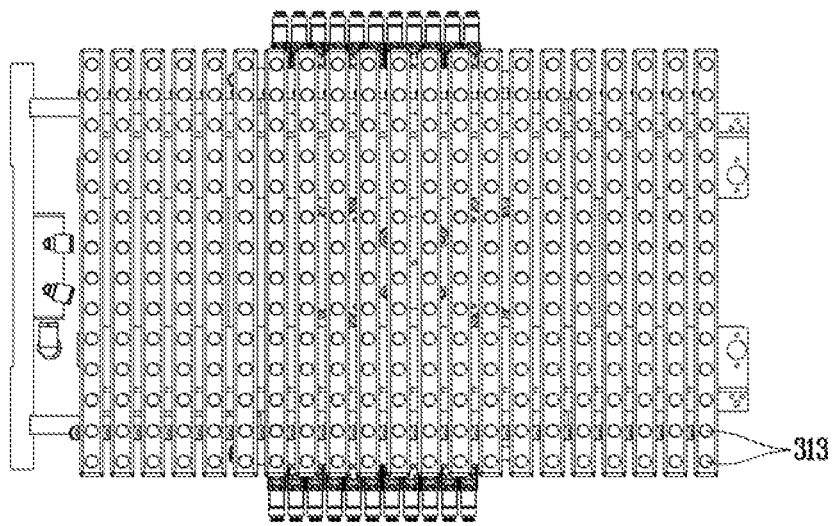

[Figure 18]
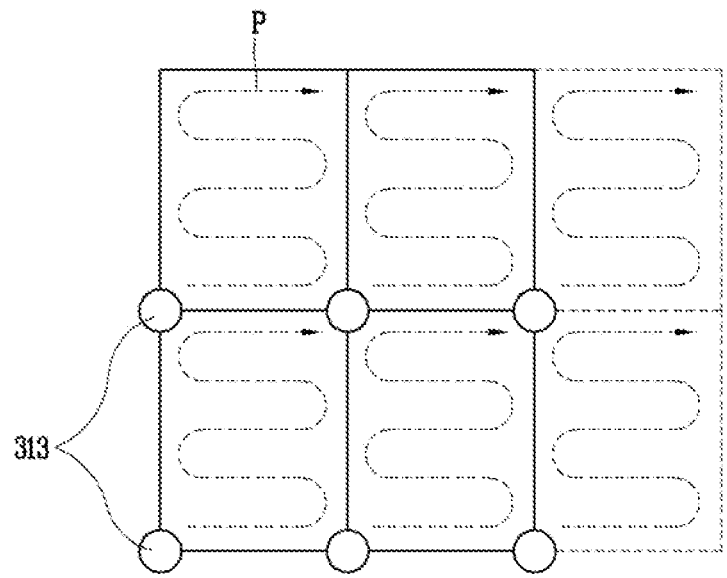
[Figure 19]
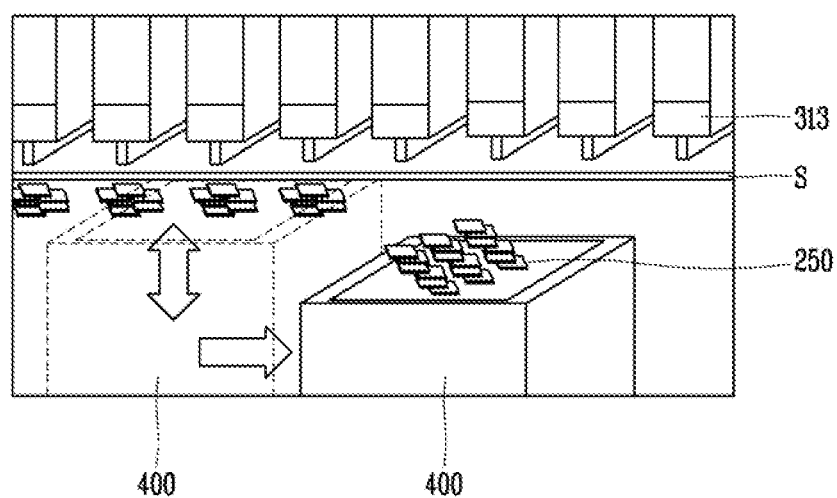

[Figure 20]
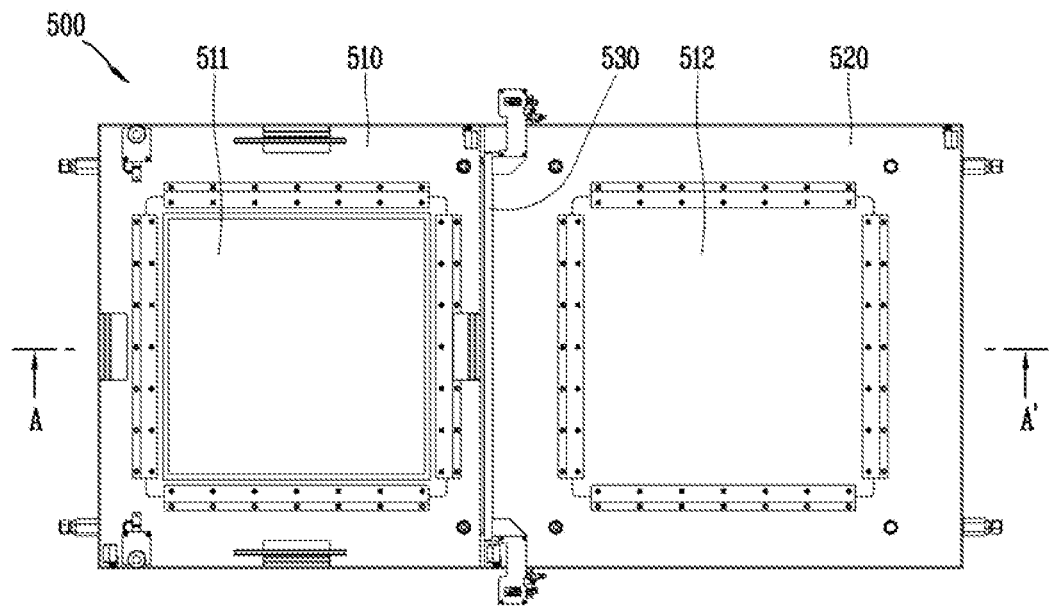
[Figure 21]
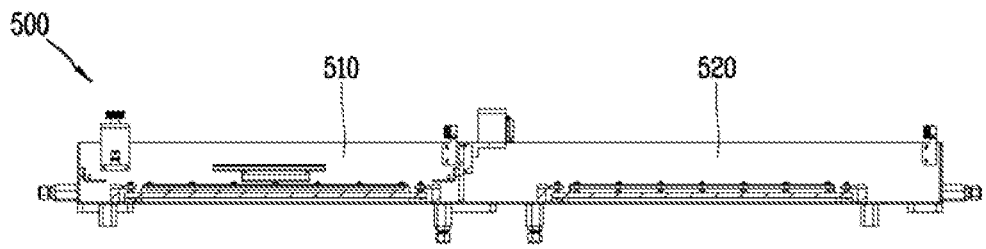
[Figure 22]
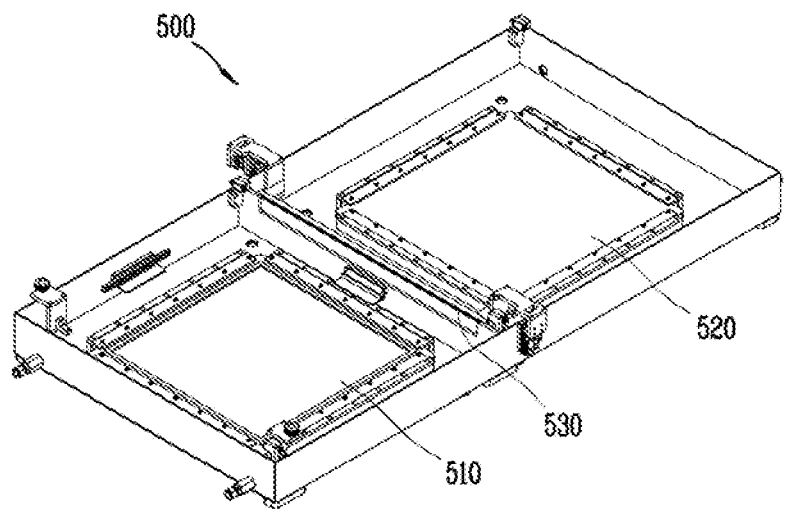

[Figure 23]
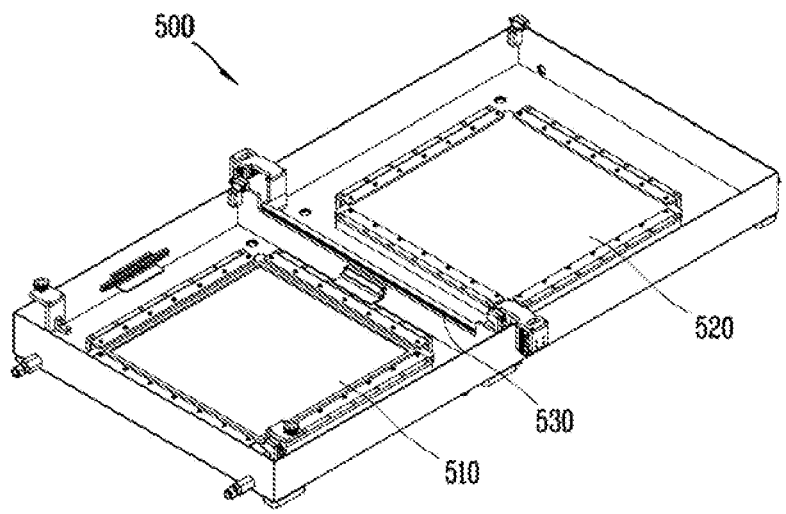
[Figure 24]
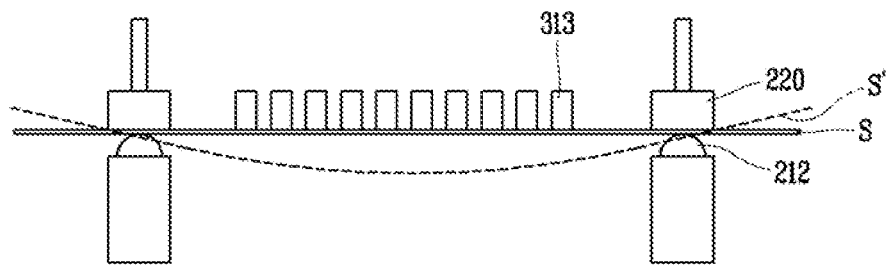

[Figure 25]
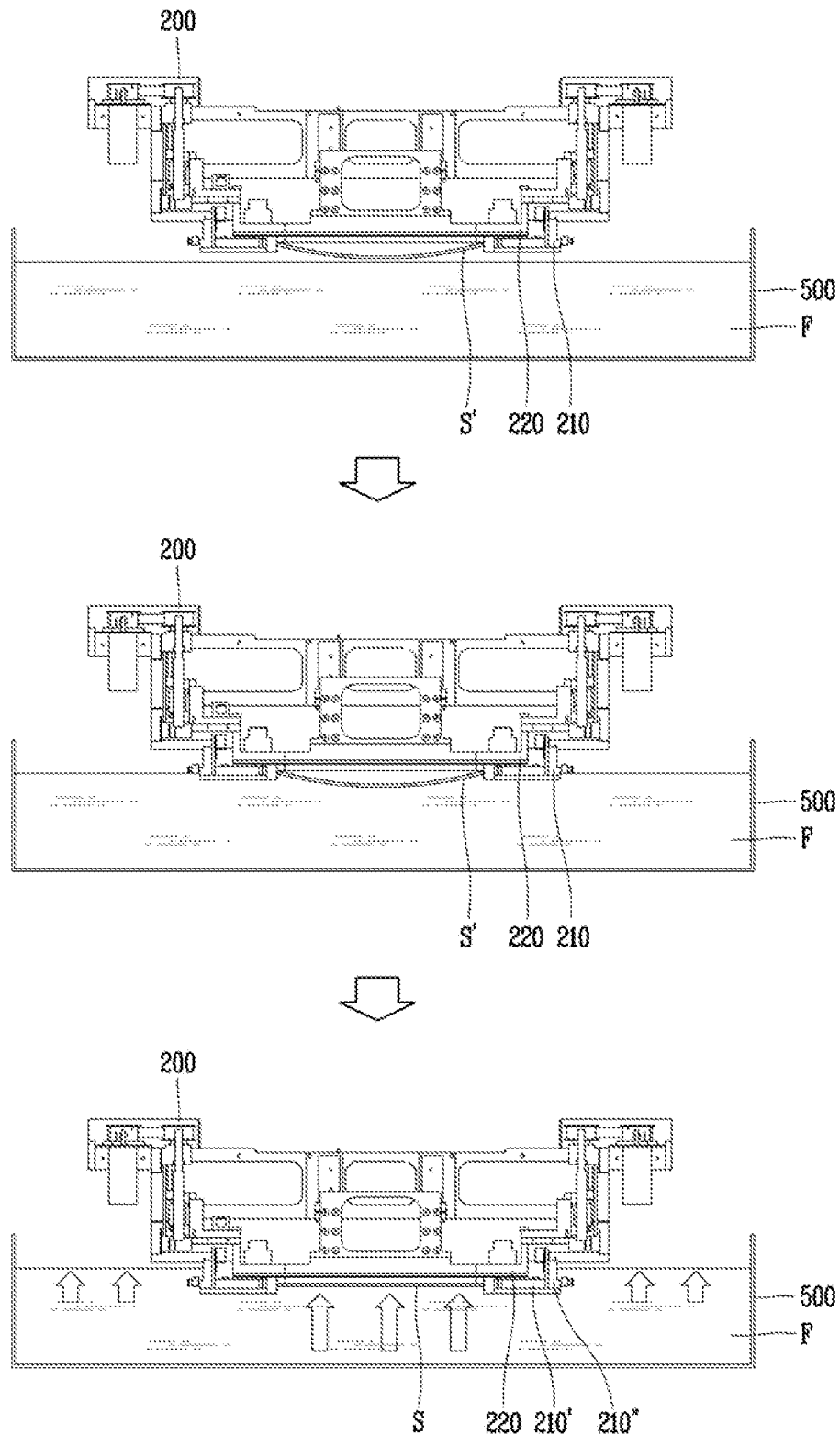

[Figure 26]  (Related Art)
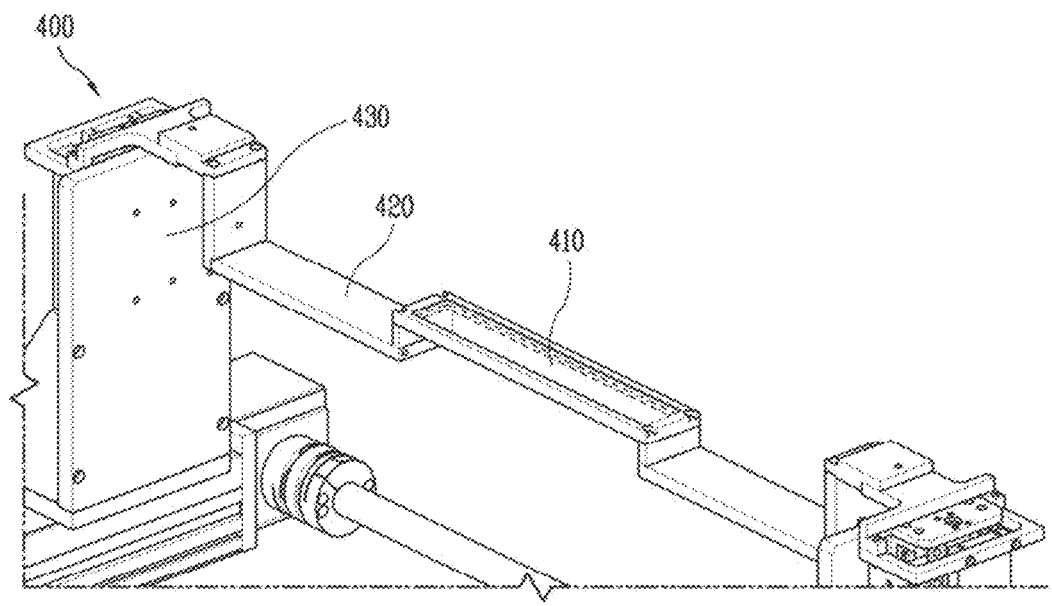
[Figure 27]  (Related Art)
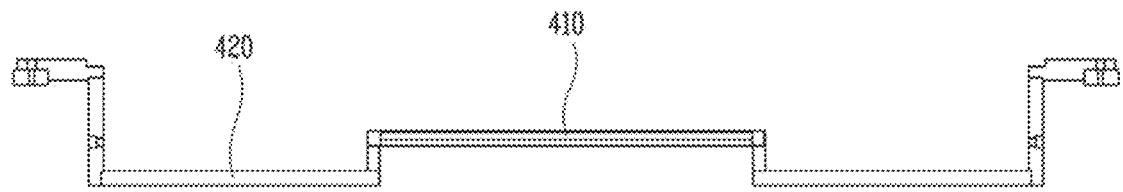
[Figure 28]  (Related Art)
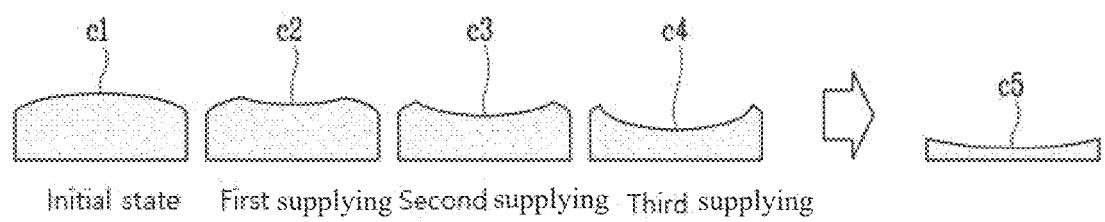

[Figure 29]
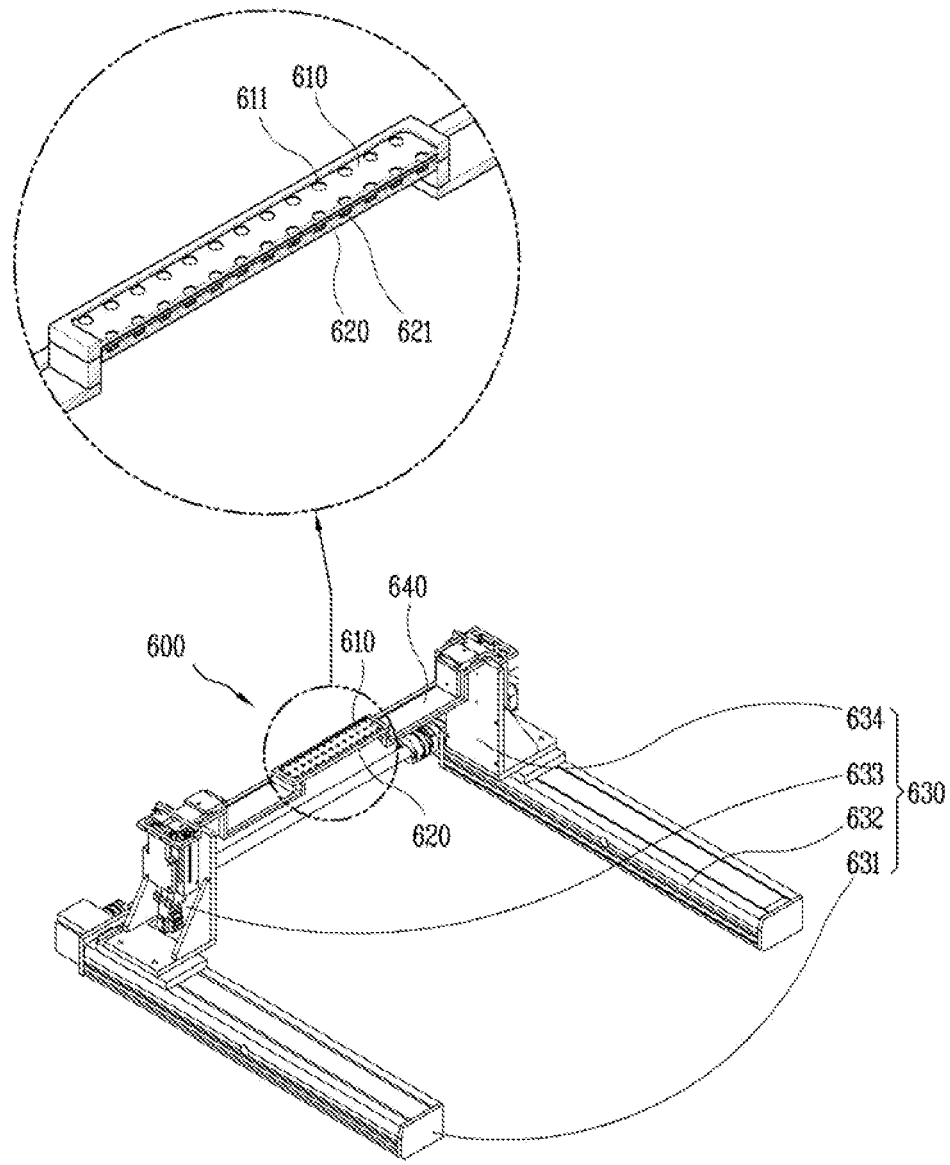
[Figure 30]
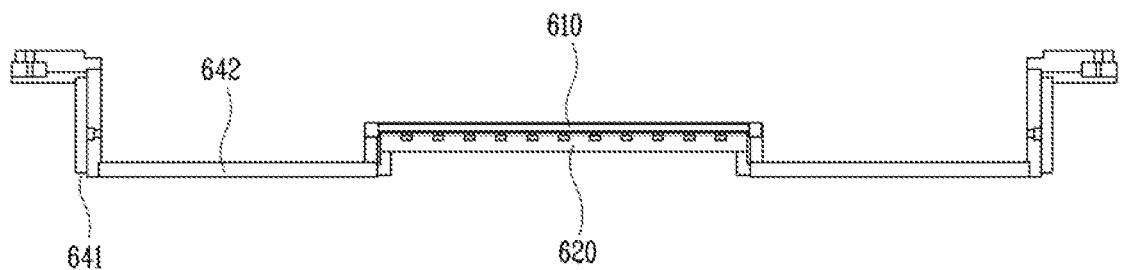

[Figure 31]
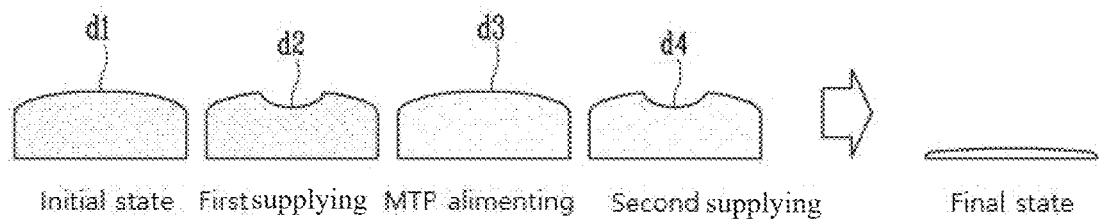
[Figure 32]
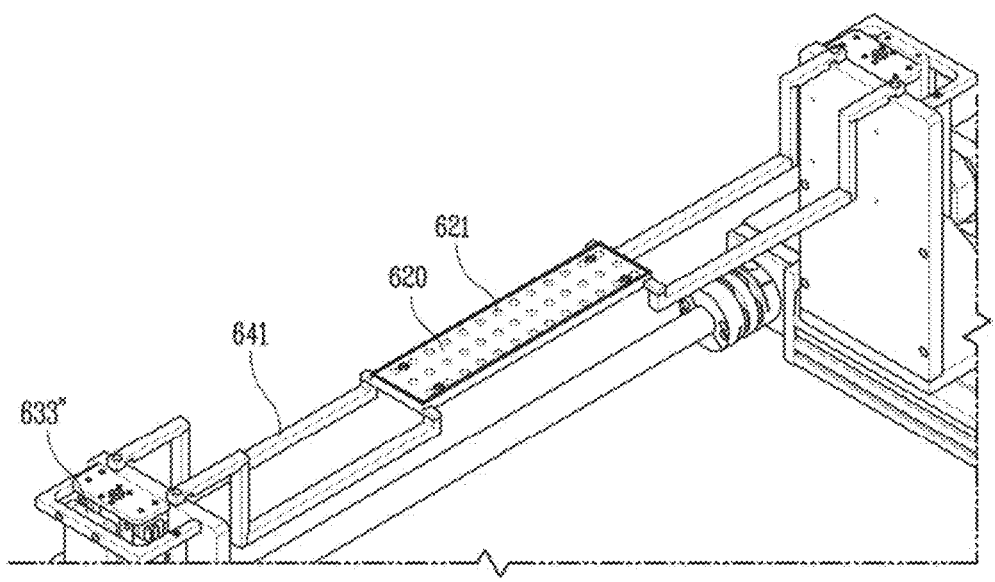
[Figure 33]
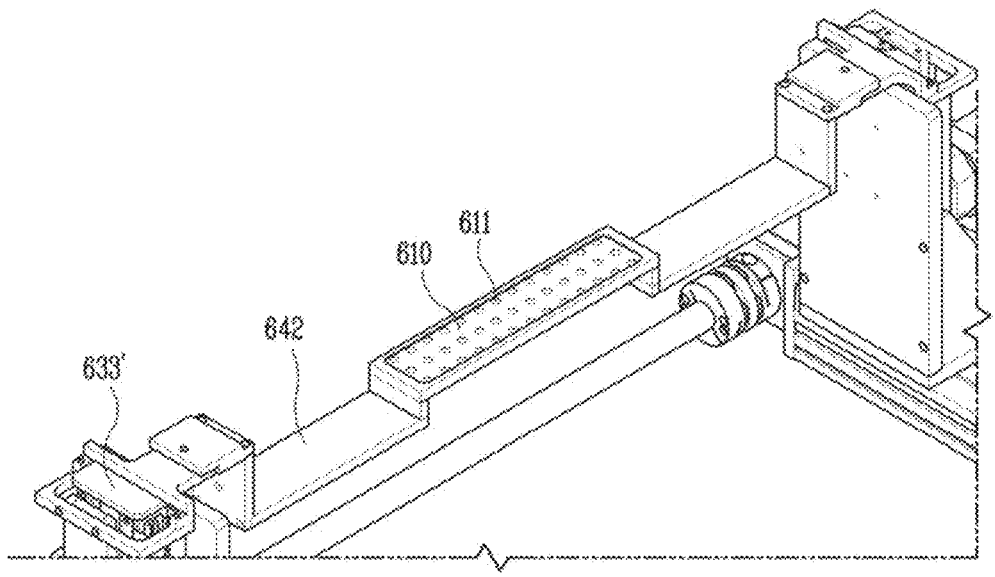

[Figure 34]
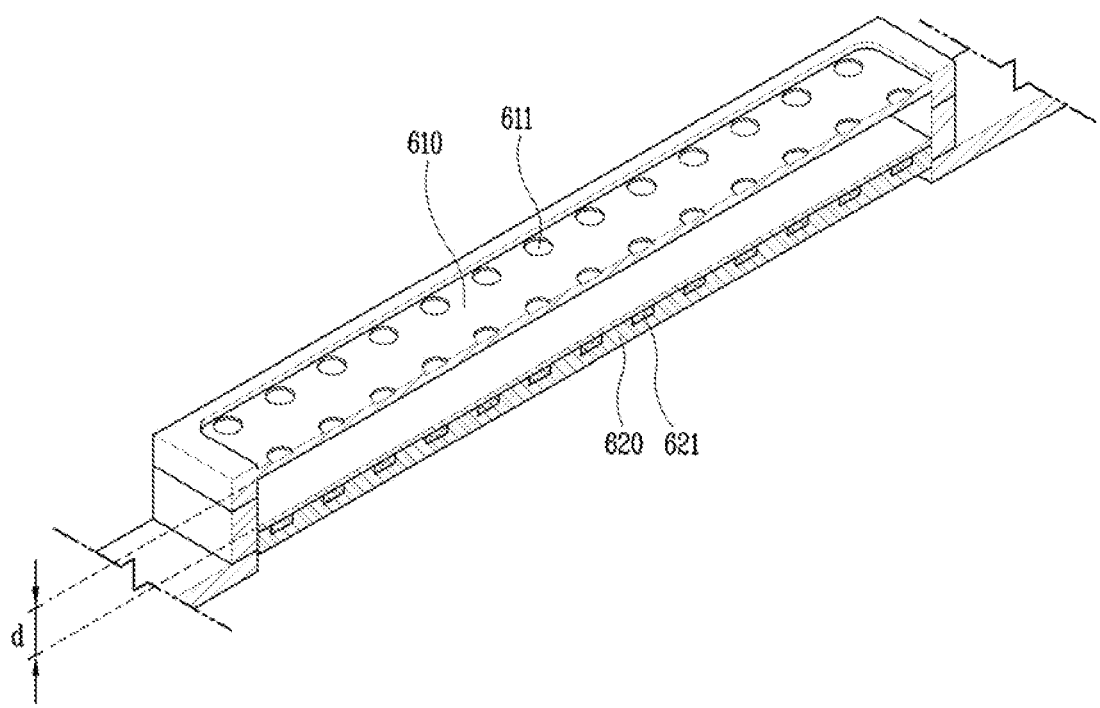
[Figure 35]
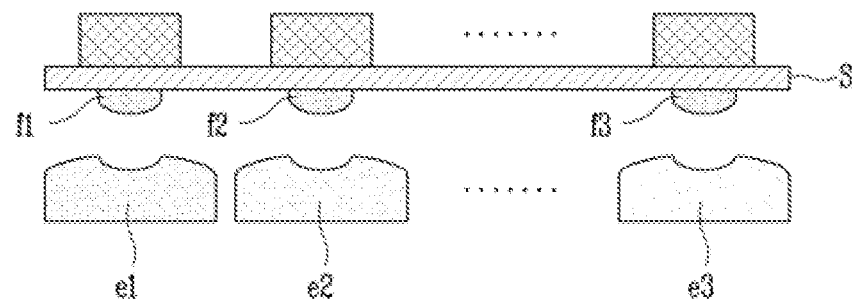

[Figure 36]
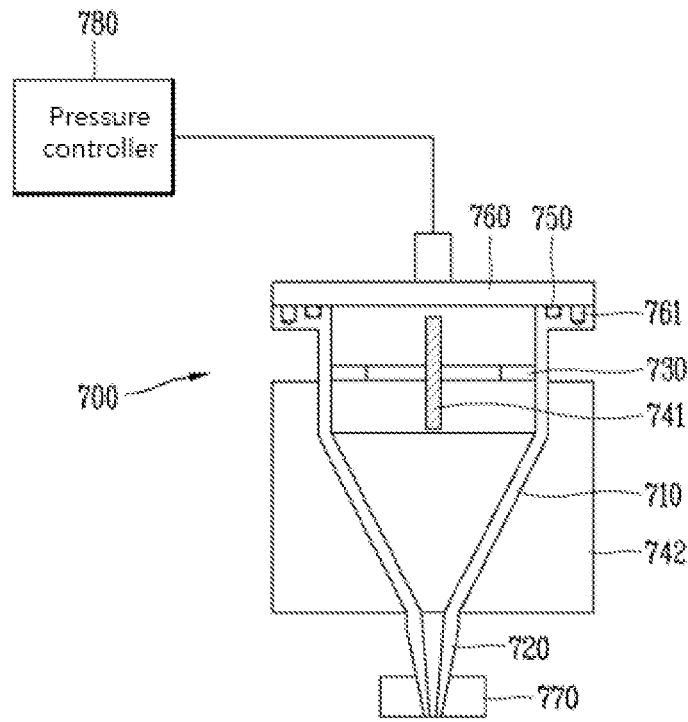
[Figure 37]
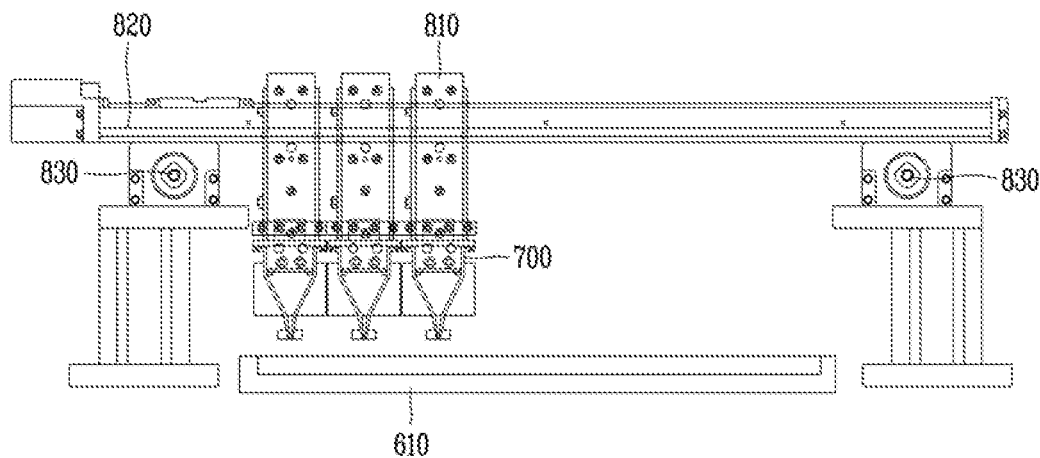

CHIP DISPENSER FOR SELF-ASSEMBLY

CROSS REFERENCE TO RELATED APPLICATIONS

This application is the National Phase of PCT International Application No. PCT/KR2020/002379, filed on Feb. 19, 2020, which claims priority under 35 U.S.C. 119 (a) to Patent Application No. 10-2020-0016576, filed in the Republic of Korea on Feb. 11, 2020, all of which are hereby expressly incorporated by reference into the present application.

TECHNICAL FIELD

The present invention relates to a method of manufacturing a display device, and more particularly, to a chip dispenser for supplying a micro-LED.

BACKGROUND ART

Recently, liquid crystal displays (LCD), organic light emitting device (OLED) display, and micro-LED displays are competing to implement large area displays in the display technology field.

On the other hand, when a semiconductor light emitting device (micro-LED) having a diameter or cross-sectional area of 100 μm or less is used for a display, very high efficiency can be provided because the display does not absorb light using a polarizer or the like. However, since a large display requires millions of semiconductor light emitting devices, it is difficult to transfer the devices compared to other technologies.

Technologies that are currently being developed as a transfer process include pick & place, Laser Lift-off (LLO), or self-assembly. Among them, the self-assembly method is a method in which the semiconductor light emitting device finds its own position in a fluid, and is the most advantageous method for realizing a large screen display device.

Recently, although a micro-LED structure suitable for self-assembly has been proposed in U.S. Pat. No. 9,825,202, research on a technology for manufacturing a display through self-assembly of micro-LED is still insufficient. Accordingly, the present invention proposes a new type of manufacturing device in which the micro-LED can be self-assembled.

DISCLOSURE

Technical Problem

An object of the present invention is to provide a new manufacturing process with high reliability in a large-screen display using a micro-sized semiconductor light emitting device.

The present invention provides a chip dispenser capable of supplying a semiconductor light emitting device on a chip tray at a constant amount and at a constant interval.

Technical Solution

In order to achieve the above purpose, the present invention provides a chip dispenser characterized in that the chip dispenser includes a body part for accommodating the fluid and the semiconductor light emitting device and discharging the accommodated fluid and the semiconductor light emitting device, and a pressure controller for varying the pressure inside the body part and a stirring part disposed in at least one of the inside and outside of the body part, agitating the fluid accommodated in the body part, In an embodiment, the pressure controller can inject a predetermined volume of gas into the body part when increasing the internal pressure of the body.

In an embodiment, the present invention can further include a nozzle part disposed at one end of the body part and discharging the fluid and the semiconductor light emitting device accommodated in the body part to the outside.

In an embodiment, it can further include a chip leakage prevention part having at least one magnet and a magnet transfer unit configured to vary a distance between the at least one magnet and the nozzle part.

In an embodiment, the magnet transfer unit can separate the at least one magnet from the nozzle part by a predetermined distance so that the fluid and the semiconductor light emitting device are discharged to the outside while the at least one magnet is spaced apart from the nozzle part by a predetermined distance and can transfer the at least one magnet such that the at least one magnet is positioned within a predetermined distance from the nozzle part in a state in which the gas fluid and the semiconductor light emitting device are not discharged to the outside.

In an embodiment, the present invention can further include a backflow prevention filter disposed inside the body part to prevent backflow of the fluid and the semiconductor light emitting device to the pressure controller.

In an embodiment, the backflow prevention filter can be configured to allow a predetermined gas to permeate.

In an embodiment, the stirring part can include an internal stirring part that is disposed inside the body part and agitates the fluid while at least a portion is submerged in the fluid.

In an embodiment, the stirring part can include an external stirring part disposed outside the body part and configured to horizontally and vertically move or rotate the body.

In an embodiment, the present invention can further include a transfer unit for transferring the body part in the horizontal and vertical directions.

EFFECTS OF THE INVENTION

According to the present invention having the above configuration, in the display device in which individual pixels are formed of micro light emitting diodes, a large number of semiconductor light emitting devices can be assembled at once.

As described above, according to the present invention, it is possible to pixelate a large amount of semiconductor light emitting devices on a small-sized wafer and then transfer them to a large area substrate. Through this, it is possible to manufacture a large area display device at a low cost.

Also, according to the present invention, by using magnetic and electric fields in solution to simultaneously transfer semiconductor light emitting devices in place, it is possible to implement low-cost, high-efficiency, and high-speed transfer regardless of the size, number, or transfer area of parts.

Furthermore, since it is an assembly by an electric field, selective assembly is possible through selective electrical application without a separate additional device or process. Also, by disposing the assembly substrate on the upper side of the chamber, loading and unloading of the substrate can be facilitated, loading and unloading can be facilitated, and non-specific assembling of the semiconductor light emitting device can be prevented.

According to the present invention, since it is possible to supply a certain amount of the fluid in which the semiconductor light emitting device is uniformly dispersed, it is possible to supply a certain amount of the semiconductor light emitting device on the chip tray.

Further, according to the present invention, since the supply position of the semiconductor light emitting device can be freely adjusted, the semiconductor light emitting device can be supplied on the chip tray at regular intervals.

DESCRIPTION OF DRAWINGS

FIG. 1 is a conceptual diagram showing an embodiment of a display device using a semiconductor light emitting device of the present invention.

FIG. 2 is a partially enlarged view of a portion A of the display device of FIG. 1.

FIG. 3 is an enlarged view of the semiconductor light emitting device of FIG. 2.

FIG. 4 is an enlarged view showing another embodiment of the semiconductor light emitting device of FIG. 2.

FIGS. 5A to 5E are conceptual views for explaining a new process of manufacturing the above-described semiconductor light emitting device.

FIG. 6 is a conceptual diagram illustrating an example of a self-assembly device for a semiconductor light emitting device according to the present invention.

FIG. 7 is a block diagram of the self-assembly device of FIG. 6.

FIGS. 8A to 8E are conceptual views illustrating a process of self-assembling a semiconductor light emitting device using the self-assembly device of FIG. 6.

FIG. 9 is a conceptual diagram for explaining the semiconductor light emitting device of FIGS. 8A to 8E.

FIG. 10 is a flowchart showing a self-assembly method according to the present invention.

FIG. 11 is a conceptual diagram showing a first state of the substrate chuck.

FIG. 12 is a conceptual diagram showing a second state of the substrate chuck.

FIG. 13 is a plan view of the first frame provided in the substrate chuck.

FIG. 14 is a conceptual diagram illustrating a state in which an assembly substrate is loaded in the substrate chuck.

FIG. 15 is a perspective view of a magnetic field forming unit according to an embodiment of the present invention.

FIG. 16 is a side view of a magnetic field forming unit according to an embodiment of the present invention.

FIG. 17 is a lower side view of a magnetic field forming unit according to an embodiment of the present invention.

FIG. 18 is a conceptual diagram showing the trajectory of the magnets provided in the magnetic field forming unit according to the present invention.

FIG. 19 is a conceptual diagram illustrating a state in which a semiconductor light emitting device is supplied.

FIG. 20 is a plan view of an assembly chamber according to an embodiment of the present invention.

FIG. 21 is a cross-sectional view taken along line A-A' in FIG. 20.

FIGS. 22 and 23 are conceptual views showing the movement of the gate provided in the assembly chamber according to an embodiment of the present invention.

FIG. 24 is a conceptual diagram illustrating a substrate warping phenomenon that occurs during self-assembly.

FIG. 25 is a conceptual diagram illustrating a method for correcting a warpage phenomenon of a substrate.

FIG. 26 is a conceptual diagram showing the structure of a chip tray of related art.

FIG. 27 is a partial cross-sectional view of a chip tray of related art.

FIG. 28 is a conceptual diagram illustrating an aggregation form of the semiconductor light emitting device remaining in the chip tray when the semiconductor light emitting device is repeatedly supplied to the assembly substrate using the chip tray.

FIG. 29 is a conceptual diagram showing the structure of a chip tray according to the present invention.

FIG. 30 is a partial cross-sectional view of a chip tray according to the present invention.

FIG. 31 is a conceptual diagram illustrating an aggregation form of the semiconductor light emitting devices remaining in the chip tray when the semiconductor light emitting devices are repeatedly supplied to an assembly substrate using the chip tray according to the present invention.

FIG. 32 is a conceptual diagram illustrating a state in which a chip alignment unit and a transfer unit are connected.

FIG. 33 is a conceptual diagram illustrating a state in which the tray unit and the conveying unit are connected.

FIGS. 34 and 35 are cross-sectional views of the tray portion and the chip alignment portion.

FIG. 36 is a cross-sectional view of a chip dispenser according to the present invention.

FIG. 37 is a conceptual diagram showing a chip dispenser having a transfer unit.

MODE FOR INVENTION

Hereinafter, the embodiments disclosed in the present specification will be described in detail with reference to the attached drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies can obscure the gist of the embodiments disclosed in the present specification, the detailed description thereof will be omitted. Also, the attached drawings are only for easy understanding of the embodiments disclosed in the present specification, and should not be construed as limiting the technical idea disclosed herein by the attached drawings.

Also, when an element such as a layer, region or substrate is referred to as being "on" another component, it will be understood that this can be directly on other elements or intervening elements can exist in between.

A display device described in this specification can include a mobile phone, a smart phone, a laptop computer, a digital broadcasting terminal, a PDA (personal digital assistant), a PMP (portable multimedia player), a navigation, a slate PC, a tablet PC (tablet PC), an ultra-book, a digital TV, a desktop computer, etc. However, the configuration according to the embodiment described in this specification can be applied as long as it can include a display even in a new product form to be developed later.

FIG. 1 is a conceptual diagram showing an embodiment of a display device using a semiconductor light emitting device of the present invention, FIG. 2 is a partial enlarged view of part A of the display device of FIG. 1, FIG. 3 is an enlarged view of the semiconductor light emitting device of FIG. 2 and FIG. 4 is an enlarged view showing another embodiment of the semiconductor light emitting device of FIG. 2.

As illustrated, information processed by the controller of the display device 100 can be output from the display module 140. A closed-loop case 101 surrounding an edge of the display module can form a bezel of the display device.

The display module 140 can include a panel 141 on which an image is displayed, the panel 141 can include a micro-sized semiconductor light emitting device 150 and a wiring substrate 110 on which the semiconductor light emitting device 150 is mounted.

A wiring can be formed on the wiring substrate 110 to be connected to the n-type electrode 152 and the p-type electrode 156 of the semiconductor light emitting device 150. Through this, the semiconductor light emitting device 150 can be provided on the wiring substrate 110 as an individual pixel that emits light.

The image displayed on the panel 141 is visual information, and is implemented by independently controlling the light emission of sub-pixels arranged in a matrix form through the wiring.

In the present invention, a micro-LED (Light Emitting Diode) is exemplified as a type of the semiconductor light emitting device 150 that converts current into light. The micro-LED can be a light emitting diode formed in a small size of 100 micrometers or less. In the semiconductor light emitting device 150, blue, red, and green colors are respectively provided in the light emitting region, and a unit pixel can be implemented by a combination thereof. That is, the unit pixel means a minimum unit for implementing one color, and at least three micro-LEDs can be provided in the unit pixel.

More specifically, referring to FIG. 3, the semiconductor light emitting device 150 can have a vertical structure.

For example, the semiconductor light-emitting device 150 can be implemented as a high-output light-emitting device that emits various types of light, including blue, by mainly using gallium nitride (GaN) and adding indium (In) and/or aluminum (Al) together.

Such a vertical semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 can be electrically connected to the p-electrode of the wiring substrate, and the upper n-type electrode 152 can be electrically connected to the n-electrode at the upper side of the semiconductor light emitting device. The vertical semiconductor light emitting device 150 has a great advantage in that it is possible to reduce the chip size because electrodes can be arranged up and down.

As another example, referring to FIG. 4, the semiconductor light emitting device can be a flip chip type light emitting device.

As an example, the semiconductor light emitting device 150' includes a p-type electrode 156', a p-type semiconductor layer 155' on which the p-type electrode 156' is formed, an active layer 154' formed on the p-type semiconductor layer 155', an n-type semiconductor layer 153' formed on the active layer 154', and an n-type electrode 152' spaced apart from the p-type electrode 156' in the horizontal direction on the n-type semiconductor layer 153'. In this case, both the p-type electrode 156' and the n-type electrode 152' can be electrically connected to the p-electrode and the n-electrode of the wiring substrate under the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. In the case of a green semiconductor light emitting device and a blue semiconductor light emitting device, gallium nitride (GaN) is mainly used, and indium (In) and/or aluminum (Al) are added together, so that it can be implemented as a high-output light emitting device emitting green or blue light. For this example, the semiconductor light emitting device can be a gallium nitride thin film formed in various layers such as n-Gan, p-Gan, AlGaN, InGan, etc. Specifically, the p-type semiconductor layer can be P-type GaN, and the n-type semiconductor layer can be N-type GaN. However, in the case of a red semiconductor light emitting device, the p-type semiconductor layer can be P-type GaAs, and the n-type semiconductor layer can be N-type GaAs.

Also, the p-type semiconductor layer can be P-type GaN doped with Mg on the p-electrode side, and the n-type semiconductor layer can be N-type GaN doped with Si on the n-electrode side. In this case, the above-described semiconductor light emitting devices can be semiconductor light emitting devices without an active layer.

On the other hand, referring to FIGS. 1 to 4, since the light emitting diode is very small, in the display panel, self-luminous unit pixels can be arranged in a high definition, through this, a high-definition display device can be implemented.

In the display device using the semiconductor light emitting device of the present invention described above, the semiconductor light emitting device grown on a wafer and formed through mesa and isolation is used as an individual pixel. In this case, the micro-sized semiconductor light emitting device 150 should be transferred to a pre-set position on the substrate of the display panel on the wafer. There is a pick and place method as such a transfer technology, but the success rate is low and a lot of time is required. As another example, there is a technique of transferring several devices at once using a stamp or a roll, but there is a limit to the yield, which is not suitable for a large screen display. The present invention proposes a new manufacturing method and manufacturing device of a display device that can solve these problems.

To this end, hereinafter, anew method of manufacturing a display device will be described. FIGS. 5A to 5E are conceptual views for explaining a new process of manufacturing the above-described semiconductor light emitting device.

In this specification, a display device using a passive matrix (PM) type semiconductor light emitting device is exemplified. However, the examples described below are also applicable to an active matrix (AM) type semiconductor light emitting device. Also, although a method of self-assembly a horizontal semiconductor light emitting device is exemplified, it is also applicable to a method of self-assembly a vertical semiconductor light emitting device.

First, according to the manufacturing method, the first conductivity type semiconductor layer 153, the active layer 154, and the second conductivity type semiconductor layer 155 are grown on the growth substrate 159, respectively (refer to FIG. 5A).

When the first conductivity type semiconductor layer 153 is grown, next, an active layer 154 is grown on the first conductivity type semiconductor layer 153, next, a second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154, and the second conductivity type semiconductor layer 155 form a stacked structure.

In this case, the first conductivity type semiconductor layer 153 can be a p-type semiconductor layer, and the second conductivity type semiconductor layer 155 can be an n-type semiconductor layer. However, the present invention is not necessarily limited thereto, and examples in which the first conductivity type is n-type and the second conductivity type is p-type are also possible.

Also, although the case in which the active layer is present is exemplified in this embodiment, a structure without the active layer is possible in some cases as described above. For this example, the p-type semiconductor layer can be P-type GaN doped with Mg, and the n-type semiconductor layer can be N-type GaN doped with Si on the n-electrode side.

The growth substrate 159 (wafer) can be formed of a material having a light-transmitting property, for example, any one of sapphire (Al2O3), GaN, ZnO, and AlO, but is not limited thereto. Also, the growth substrate 1059 can be formed of a material suitable for semiconductor material growth, a carrier wafer. Also, it can be formed of a material with excellent thermal conductivity, including a conductive substrate or an insulating substrate, for example, at least one of Si, GaAs, GaP, InP, Ga2O3 or a SiC substrate having higher thermal conductivity than a sapphire (Al2O3) substrate can be used.

Next, at least some of the first conductivity type semiconductor layer 153, the active layer 154, and the second conductivity type semiconductor layer 155 are removed to form a plurality of semiconductor light emitting devices (refer to FIG. 5B).

More specifically, isolation is performed so that a plurality of light emitting devices form a light emitting device array. That is, the first conductivity type semiconductor layer 153, the active layer 154, and the second conductivity type semiconductor layer 155 are vertically etched to form a plurality of semiconductor light emitting devices.

If a horizontal semiconductor light emitting device is formed, the active layer 154 and the second conductivity type semiconductor layer 155 are partially removed in the vertical direction, a mesa process in which the first conductivity type semiconductor layer 153 is exposed to the outside, and an isolation process in which the first conductivity type semiconductor layer is etched to form a plurality of semiconductor light emitting device arrays can be performed thereafter.

Next, second conductive electrodes 156 (or p-type electrodes) are respectively formed on one surface of the second conductivity type semiconductor layer 155 (refer to FIG. 5C). The second conductive electrode 156 can be formed by a deposition method such as sputtering, but the present invention is not limited thereto. However, when the first conductivity type semiconductor layer and the second conductivity type semiconductor layer are an n-type semiconductor layer and a p-type semiconductor layer, respectively, the second conductive electrode 156 can be an n-type electrode.

Next, the growth substrate 159 is removed to provide a plurality of semiconductor light emitting devices. For example, the growth substrate 1059 can be removed using a laser lift-off (LLO) method or a chemical lift-off (CLO) method (refer to FIG. 5D).

Thereafter, a step of settling the semiconductor light emitting devices 150 on a substrate in a chamber filled with a fluid is performed (refer to FIG. 5E).

For example, the semiconductor light emitting devices 150 and the substrate are put in a chamber filled with a fluid, and the semiconductor light emitting devices are self-assembled on the substrate 1061 using flow, gravity, surface tension, and the like. In this case, the substrate can be the assembly substrate 161.

As another example, it is also possible to put a wiring substrate in an assembly chamber instead of the assembly substrate 161 so that the semiconductor light emitting devices 150 are directly disposed on the wiring substrate. In this case, the substrate can be a wiring substrate. However, for convenience of description, in the present invention, the substrate is provided as the assembly substrate 161 to exemplify that the semiconductor light emitting devices 1050 are mounted.

Cells (not shown) in which the semiconductor light emitting devices 150 are inserted can be provided in the assembly substrate 161 to facilitate mounting of the semiconductor light emitting devices 150 on the assembly substrate 161. Specifically, cells in which the semiconductor light emitting devices 150 are disposed are formed on the assembly substrate 161 at positions where the semiconductor light emitting devices 150 are aligned with the wiring electrodes. The semiconductor light emitting devices 150 are assembled to the cells while moving in the fluid.

After arranging a plurality of semiconductor light emitting devices on the assembly substrate 161, if the semiconductor light emitting devices of the assembly substrate 161 are transferred to a wiring substrate, large area transfer is possible. Accordingly, the assembly substrate 161 can be referred to as a temporary substrate.

On the other hand, in order to apply the self-assembly method described above to the manufacture of a large-screen display, it is necessary to increase the transfer yield. The present invention proposes a method and device for minimizing the influence of gravity or frictional force and preventing non-specific assembling in order to increase the transfer yield.

In this case, in the display device according to the present invention, a magnetic material is disposed on a semiconductor light emitting device to move the semiconductor light emitting device using magnetic force, and the semiconductor light emitting device is disposed at a pre-set position by using an electric field during the movement process. Hereinafter, such a transfer method and device will be described in more detail with the attached drawings.

FIG. 6 is a conceptual diagram illustrating an example of a self-assembly device for a semiconductor light emitting device according to the present invention, and FIG. 7 is a block diagram of the self-assembly device of FIG. 6. FIGS. 8A to 8D are conceptual views illustrating a process of self-assembly a semiconductor light emitting device using the self-assembly device of FIG. 6, and FIG. 9 is a conceptual diagram for explaining the semiconductor light emitting device of FIGS. 8A to 8D.

Referring to FIGS. 6 and 7, the self-assembly device 160 of the present invention can include the assembly chamber 162, a magnet 163, and a position controller 164.

The assembly chamber 162 has a space for accommodating a plurality of semiconductor light emitting devices. The space can be filled with a fluid, and the fluid can include water as the assembly solution. Accordingly, the assembly chamber 162 can be a water tank and can be configured as an open type. However, the present invention is not limited thereto, and the assembly chamber 162 can be of a closed type in which the space is a closed space.

In the assembly chamber 162, the substrate 161 can be disposed such that an assembly surface on which the semiconductor light emitting devices 150 are assembled faces downward. For example, the substrate 161 can be transferred to an assembly position by a transfer unit, and the transfer unit can include a stage 165 on which the substrate is mounted. The position of the stage 165 is adjusted by the controller, and through this, the substrate 161 can be transferred to the assembly position.

At this time, the assembly surface of the substrate 161 faces the bottom of the assembly chamber 150 in the assembly position. As shown, the assembly surface of the substrate 161 is arranged to be immersed in the fluid in the assembly chamber 162. Accordingly, the semiconductor light emitting device 150 moves to the assembly surface in the fluid.

The substrate 161 is an assembly substrate capable of forming the electric field, and can include a base part 161a, a dielectric layer 161b, and a plurality of electrodes 161c.

The base part 161a can be made of an insulating material, and the plurality of electrodes 161c can be thin film or thick film bi-planar electrodes patterned on one surface of the base part 161a. The electrode 161c can be formed of, for example, a stack of Ti/Cu/Ti, Ag paste, ITO, or the like.

The dielectric layer 161b can be made of an inorganic material such as SiO2, SiNx, SiON, Al2O3, TiO2, HfO2, or the like. Alternatively, the dielectric layer 161b can be formed of a single layer or a multi-layer as an organic insulator. The thickness of the dielectric layer 161b can be in the range of several tens of nm to several µm.

Furthermore, the substrate 161 according to the present invention includes a plurality of cells 161d partitioned by barrier wall. The cells 161d are sequentially arranged in one direction and can be made of a polymer material. Also, the barrier wall 161e forming the cells 161d are shared with the neighboring cells 161d. The barrier wall 161e protrudes from the base part 161a, and the cells 161d can be sequentially disposed along one direction by the barrier wall 161e. More specifically, the cells 161d can be sequentially arranged in the column and row directions, respectively, and can have a matrix structure.

Inside the cells 161d, as shown, a groove for accommodating the semiconductor light emitting device 150 is provided, and the groove can be a space defined by the barrier wall 161e. The shape of the groove can be the same as or similar to that of the semiconductor light emitting device. For example, when the semiconductor light emitting device has a rectangular shape, the groove can have a rectangular shape. Also, although not shown, when the semiconductor light emitting device has a circular shape, the grooves formed in the cells can have a circular shape. Furthermore, each of the cells is configured to accommodate a single semiconductor light emitting device. That is, one semiconductor light emitting device is accommodated in one cell.

Meanwhile, the plurality of electrodes 161c can include a plurality of electrode lines disposed at the bottom of each of the cells 161d, and the plurality of electrode lines can extend to adjacent cells.

The plurality of electrodes 161c are disposed below the cells 161d, and different polarities are applied to each other to generate an electric field in the cells 161d. To form the electric field, the dielectric layer can form the bottom of the cells 161d while covering the plurality of electrodes 161c with the dielectric layer. In this structure, when different polarities are applied to the pair of electrodes 161c under each of the cells 161d, an electric field can be formed, and the semiconductor light emitting device can be inserted into the cells 161d by the electric field.

In the assembly position, the electrodes of the substrate 161 are electrically connected to the power supply unit 171. The power supply unit 171 applies power to the plurality of electrodes to generate the electric field.

As shown, the self-assembly device can include a magnet 163 for applying a magnetic force to the semiconductor light emitting devices. The magnet 163 is spaced apart from the assembly chamber 162 to apply a magnetic force to the semiconductor light emitting devices 150. The magnet 163 can be disposed to face the opposite surface of the assembly surface of the substrate 161, and the position of the magnet is controlled by the position controller 164 connected to the magnet 163.

The semiconductor light emitting device 1050 can include a magnetic material to move in the fluid by the magnetic field of the magnet 163.

Referring to FIG. 9, in a semiconductor light emitting device including a magnetic material can include a first conductive electrode 1052 and a second conductive electrode 1056, a first conductivity type semiconductor layer 1053 on which the first conductive electrode 1052 is disposed, a second conductivity type semiconductor layer 1055 overlapping the first conductivity type semiconductor layer 1052 and on which the second conductive electrode 1056 is disposed, and an active layer 1054 disposed between the first and second conductivity type semiconductor layers 1053 and 1055.

Here, the first conductivity type can be a p-type, and the second conductivity type can be configured as an n-type, and vice versa. Also, as described above, it can be a semiconductor light emitting device without the active layer.

Meanwhile, in the present invention, the first conductive electrode 1052 can be generated after the semiconductor light emitting device is assembled on the wiring substrate by self-assembly of the semiconductor light emitting device. Also, in the present invention, the second conductive electrode 1056 can include the magnetic material. The magnetic material can mean a magnetic metal. The magnetic material can be Ni, SmCo, or the like, and as another example, can include a material corresponding to at least one of Gd-based, La-based, or Mn-based materials.

The magnetic material can be provided on the second conductive electrode 1056 in the form of particles. Alternatively, in a conductive electrode including a magnetic material, one layer of the conductive electrode can be formed of a magnetic material. For this example, as shown in FIG. 9, the second conductive electrode 1056 of the semiconductor light emitting device 1050 can include a first layer 1056a and a second layer 1056b. Here, the first layer 1056a can include a magnetic material, and the second layer 1056b can include a metal material not a magnetic material.

As shown, in this example, the first layer 1056a including a magnetic material can be disposed to contact the second conductivity type semiconductor layer 1055. In this case, the first layer 1056a is disposed between the second layer 1056b and the second conductivity type semiconductor layer 1055. The second layer 1056b can be a contact metal connected to the second electrode of the wiring substrate. However, the present invention is not necessarily limited thereto, and the magnetic material can be disposed on one surface of the first conductivity type semiconductor layer.

Referring back to FIGS. 6 and 7, more specifically, the self-assembly device can include a magnet handler capable of automatically or manually moving the x, y, and z axes on the upper side of the assembly chamber, or a motor capable of rotating the magnet 163. The magnet handler and the motor can constitute the position controller 164. Through this, the magnet 163 rotates in a horizontal direction, clockwise or counterclockwise direction with the substrate 161.

Meanwhile, a light-transmitting bottom plate 166 can be formed in the assembly chamber 162, and the semiconductor light emitting devices can be disposed between the bottom plate 166 and the substrate 161. An image sensor 167 can be disposed to face the bottom plate 166 to monitor the inside of the assembly chamber 162 through the bottom plate 166. The image sensor 167 is controlled by the controller 172 and can include an inverted type lens and a CCD to observe the assembly surface of the substrate 161.

The self-assembly device described above can be made to use a combination of a magnetic field and an electric field. Using this, the semiconductor light emitting devices can be mounted at a pre-set position on the substrate by the electric field while the semiconductor light emitting devices are moved by a change in the position of the magnet. Hereinafter, the assembly process using the self-assembly device described above will be described in more detail.

First, a plurality of semiconductor light emitting devices 1050 including a magnetic material are formed through the process described with reference to FIGS. 5A to 5C. In this case, in the process of forming the second conductive electrode of FIG. 5C, a magnetic material can be deposited on the semiconductor light emitting device.

Next, the substrate 161 is transferred to the assembly position, and the semiconductor light emitting devices 1050 are put into the assembly chamber 162 (refer to FIG. 8A).

As described above, the assembly position of the substrate 161 can be a position in which the assembly surface of the substrate 161 on which the semiconductor light emitting devices 1050 are assembled faces downward in the assembly chamber 162.

In this case, some of the semiconductor light emitting devices 1050 can sink to the bottom of the assembly chamber 162 and some can float in the fluid. When the light-transmitting bottom plate 166 is provided in the assembly chamber 162, some of the semiconductor light emitting devices 1050 can sink to the bottom plate 166.

Next, a magnetic force is applied to the semiconductor light emitting devices 1050 so that the semiconductor light emitting devices 1050 vertically float in the assembly chamber 162 (refer to FIG. 8B).

When the magnet 163 of the self-assembly device moves from its original position to the opposite surface of the assembly surface of the substrate 161, the semiconductor light emitting devices 1050 are raised in the fluid toward the substrate 161. The original position can be a position deviated from the assembly chamber 162. As another example, the magnet 163 can be configured as an electromagnet. In this case, electricity is supplied to the electromagnet to generate an initial magnetic force.

Meanwhile, in this example, if the magnitude of the magnetic force is adjusted, the separation distance between the assembly surface of the substrate 161 and the semiconductor light emitting devices 1050 can be controlled. For example, the separation distance is controlled using the weight, buoyancy, and magnetic force of the semiconductor light emitting devices 1050. The separation distance can be several millimeters to several tens of micrometers from the outermost surface of the substrate.

Next, a magnetic force is applied to the semiconductor light emitting devices 1050 so that the semiconductor light emitting devices 1050 move in one direction in the assembly chamber 162. For example, the magnet 163 moves in a direction parallel to the substrate, clockwise or counterclockwise (refer to FIG. 8C). In this case, the semiconductor light emitting devices 1050 move in a direction parallel to the substrate 161 at a position spaced apart from the substrate 161 by the magnetic force.

Next, in the process of moving the semiconductor light emitting devices 1050, a step of inducing the semiconductor light emitting devices 1050 to the pre-set position by applying an electric field so as to be disposed at a pre-set position of the substrate 161 is performed (refer to FIG. 8C). For example, while the semiconductor light emitting devices 1050 are moving in a direction horizontal to the substrate 161, and move in a direction perpendicular to the substrate 161 by the electric field and are disposed at a pre-set position on the substrate 161.

More specifically, power is supplied to the bi-planar electrode of the substrate 161 to generate an electric field, and by using this, assembly is induced only at a pre-set position. That is, by using the selectively generated electric field, the semiconductor light emitting devices 1050 are self-assembled at the assembly position of the substrate 161. To this end, cells in which the semiconductor light emitting devices 1050 are inserted can be provided on the substrate 161.

Thereafter, the unloading process of the substrate 161 proceeds, and the assembly process is completed. When the substrate 161 is an assembly substrate, a post-process to implement a display device by transferring the semiconductor light emitting devices arranged as described above to a wiring substrate can be performed.

Meanwhile, after guiding the semiconductor light emitting devices 1050 to the pre-set position, the magnet 163 can be moved in a direction away from the substrate 161 so that the semiconductor light emitting devices 1050 remaining in the assembly chamber 162 fall to the bottom of the assembly chamber (FIG. 8D). As another example, when power supply is stopped when the magnet 163 is an electromagnet, the semiconductor light emitting devices 1050 remaining in the assembly chamber 162 fall to the bottom of the assembly chamber 162.

Thereafter, when the semiconductor light emitting devices 1050 at the bottom of the assembly chamber 162 are recovered, the recovered semiconductor light emitting devices 1050 can be reused.

Above In order to increase assembly yield in fluidic assembly, the self-assembly device and method described uses a magnetic field to focus distant components near a pre-set assembly site, and applies a separate electric field to the assembly site to selectively assemble components only at the assembly site. At this time, the assembly substrate is placed on the upper part of the water tank and the assembly surface is directed downward to minimize the effect of gravity due to the weight of the parts and prevent non-specific assembling to eliminate defects. That is, to increase the transfer yield, the assembly substrate is placed on the upper part to minimize the influence of gravity or frictional force, and non-specific assembling is prevented.

As described above, according to the present invention having the above configuration, in a display device in which individual pixels are formed of semiconductor light emitting devices, a large number of semiconductor light emitting devices can be assembled at once.

As described above, according to the present invention, it is possible to pixelate a large amount of semiconductor light emitting devices on a small-sized wafer and then transfer them to a large area substrate. Through this, it is possible to manufacture a large area display device at a low cost.

When performing the above-described self-assembly process, several problems may occur.

First, as the area of the display increases, the area of the assembly substrate increases, and as the area of the assembly substrate increases, the problem of bending of the substrate increases. When self-assembly is performed in a bent state of the assembly substrate, since a magnetic field is not uniformly formed on the surface of the assembly substrate, it is difficult to stably perform self-assembly.

Second, since the semiconductor light emitting device cannot be completely uniformly dispersed in the fluid, and the magnetic field formed on the surface of the assembly substrate cannot be perfectly uniform, a problem that the semiconductor light emitting device is concentrated only on a part of the assembly substrate can occur.

The present invention provides a self-assembly device capable of increasing the self-assembly yield as well as solving the above-mentioned problems.

The self-assembly device according to the present invention can include a substrate surface treatment unit, a substrate chuck 200, a magnetic field forming unit 300, a chip supply unit 400, and an assembly chamber 500. However, the present invention is not limited thereto, and the self-assembly device according to the present invention can include more or fewer components than the above-described components.

Before describing the self-assembly device according to the present invention, a self-assembly method using the self-assembly device according to the present invention will be briefly described.

FIG. 10 is a flowchart showing a self-assembly method according to the present invention.

First, the surface treatment step (S110) of the assembly substrate is performed. Although this step is not essential, when the surface of the substrate becomes hydrophilic, it is possible to prevent bubbles from forming on the surface of the substrate.

Next, the step of loading the assembly substrate into the substrate chuck (S120) proceeds. The assembly substrate loaded on the substrate chuck 200 is transferred to an assembly position of the assembly chamber. Thereafter, the magnetic field forming unit approaches the assembly substrate through vertical and horizontal movement.

In this state, the step of supplying the chip (S130) proceeds. Specifically, the step of dispersing the semiconductor light emitting device on the assembly surface of the assembly substrate proceeds. When the semiconductor light emitting device is dispersed near the assembly surface in a state where the magnetic field forming unit 300 is sufficiently close to the assembly substrate, the semiconductor light emitting device is attached to the assembly surface by the magnetic field forming unit. The semiconductor light emitting devices are dispersed on the assembly surface with a suitable dispersion.

However, the present invention is not limited thereto, and the semiconductor light emitting device can be dispersed in the fluid in the assembly chamber before the substrate is transferred to the assembly position. That is, the timing of performing the chip supply step (S130) is not limited to after the assembly substrate is transferred to the assembly position.

The supply method of the semiconductor light emitting device can vary depending on the area of the assembly substrate, the type of the semiconductor light emitting device to be assembled, the self-assembly speed, and the like.

After that, self-assembly is performed, and a step (S140) of recovering the semiconductor light emitting device is performed. The self-assembly will be described later along with a description of the self-assembly device according to the present invention. On the other hand, the semiconductor light emitting device does not necessarily need to be recovered after self-assembly. After the self-assembly is completed, self-assembly of a new substrate can be performed after replenishing the semiconductor light emitting device in the assembly chamber.

Finally, after the self-assembly is completed, the step (S150) of inspecting and drying the assembly substrate and separating the substrate from the substrate chuck can be performed. The inspection of the assembly substrate can be performed at a position where self-assembly is performed, and can be performed after transferring the assembly substrate to another location.

Meanwhile, drying of the assembly substrate can be performed after the assembly substrate is separated from the fluid. After drying the assembly substrate, a self-assembly post process can be performed.

The basic principle of self-assembly, the structure of the substrate (or assembly substrate), and the contents of the semiconductor light emitting device are replaced with those described in FIGS. 1 to 9. On the other hand, the vertical moving part, the horizontal moving part, the rotating part and other moving means described below can be implemented through well-known various means, such as a motor and a ball screw, a rack gear and a pinion gear, a pulley and a timing belt, and thus a detailed description will be omitted.

Meanwhile, the controller 172 described with reference to FIG. 7 controls the movement of the vertical moving part, the horizontal moving part, the rotating unit, and other moving means provided in the above-described components. That is, the controller 172 is configured to control the movement and rotational movement of the x, y, and z axes of each component. Although not separately mentioned herein, the movement of the vertical moving part, the horizontal moving part, the rotating unit, and other moving means is generated by the control of the controller 172.

On the other hand, the electrode 161c provided in the substrate (or assembly substrate, 161) described with reference to FIGS. 6 to 9 is referred to as an assembly electrode, and the assembly electrode 161c is described in FIG. 7 through the substrate chuck 200. It is electrically connected to the power supply unit 171, and the power supply unit 171 supplies power to the assembly electrode 161c under the control of the controller 172. A detailed description thereof will be given later.

Hereinafter, the above-described components will be described.

First, the substrate surface treatment unit serves to make the substrate surface hydrophilic. Specifically, the self-assembly device according to the present invention performs self-assembly in a state in which the assembly substrate is in contact with the fluid surface. When the assembly surface of the assembly substrate has a property different from the fluid surface, bubbles can occur on the assembly surface, and non-specific bonding between the semiconductor light emitting device and the assembly surface can occur. To prevent this, the substrate surface before self-assembly can be treated with a fluid-friendly property.

In an embodiment, when the fluid is a polar material such as water, the substrate surface treatment unit can make the assembly surface of the substrate hydrophilic.

For example, the substrate surface treatment unit can include a plasma generator. Through plasma treatment of the substrate surface, hydrophilic functional groups can be formed on the substrate surface. Specifically, hydrophilic functional groups can be formed on at least one of a barrier wall and a dielectric layer provided in the substrate through plasma processing.

Meanwhile, different surface treatments can be performed on the surface of the barrier wall and the surface of the dielectric layer exposed to the outside by the cell in order to prevent non-specific assembling of the semiconductor light emitting device. For example, a hydrophilic treatment can be performed on the surface of the dielectric layer exposed to the outside by the cell, and the surface treatment can be performed to form a hydrophobic functional group on the surface of the barrier wall. Through this, non-specific assembling of the semiconductor light emitting device to the barrier wall surface can be prevented, and the semiconductor light emitting device can be strongly fixed inside the cell.

However, the substrate surface treatment unit is not an essential component in the self-assembly device according to the present invention. The substrate surface treatment unit cannot be necessary depending on the constituent materials constituting the substrate.

The substrate on which the surface treatment has been completed by the substrate surface treatment unit is loaded into the substrate chuck 200.

Next, the substrate chuck 200 will be described.

FIG. 11 is a conceptual diagram illustrating a first state of the substrate chuck, FIG. 12 is a conceptual diagram illustrating a second state of the substrate chuck, FIG. 13 is a plan view of a first frame provided in the substrate chuck, and FIG. 14 is a conceptual diagram illustrating a state in which an assembly substrate is loaded in the substrate chuck.

Referring to the accompanying drawings, the substrate chuck 200 is provided with a substrate support. In an embodiment, the substrate support unit includes first and second frames 210 and 220, and a fixing unit 230. The first and second frames 210 and 220 are vertically disposed with a loaded substrate therebetween, and the fixing unit 230 supports the first and second frames 210 and 220. The substrate chuck 200 can include a rotating unit 240, a vertical moving part, and a horizontal moving part 250. As shown in FIG. 11, the vertical moving part and the horizontal moving part 250 can be configured as one device. Meanwhile, without being limited to the drawings to be described later, the rotating unit and the vertical and horizontal moving parts provided in the substrate chuck can be formed as a single device.

In the present specification, the first frame 210 is defined as a frame disposed under the substrate in a state where the assembly surface of the substrate S faces the fluid, and the second frame 220 is defined as a frame disposed above the substrate with the assembly surface of the substrate facing the fluid. Due to the rotation unit 240, the vertical relationship between the first frame 210 and the second frame 220 can be switched with each other. In the present specification, a state in which the first frame 210 is lower than the second frame 220 is defined as a first state (see FIG. 11), and a state in which the first frame 210 is positioned above the second frame 220 is defined as a second state (refer to FIG. 12). The rotating unit 240 rotates at least one of the first and second frames 210 and 220 and the fixing unit 230 to switch from any one of the first and second states to the other. The rotating part 240 will be described later.

The first frame 210 is a frame that comes into contact with the fluid filled in the assembly chamber during self-assembly. Referring to FIG. 14, the first frame 210 includes a bottom part 210' and a side wall part 210".

The bottom part 210' serves to support the substrate on the lower side or the upper side of the substrate S when the substrate S is loaded. The bottom part 210' can be formed in a single plate shape or in a form in which a plurality of members forming a plate shape are combined. Referring to FIG. 13, the bottom part 210' has a hole 210"" passing through the central portion. The hole 210"' exposes a substrate, which will be described later, to the outside so that it can be in contact with the fluid. That is, the hole 210"" defines an assembly surface of the substrate. The substrate is loaded so that the four corners of the rectangular substrate span the rim of the hole 210"" of the first frame 210. Accordingly, the remaining area except for the edge of the substrate overlaps the hole 210"" provided in the first frame 210. A region of the substrate overlapping the hole 210"" becomes an assembly surface.

Meanwhile, a sealing part 212 and an electrode connection unit 213 can be disposed on the edge of the hole 210"".

The sealing part 212 is in close contact with the substrate to prevent the fluid filled in the assembly chamber from penetrating into the first and second frames 210 and 220 during self-assembly. Also, the sealing part 212 prevents the fluid from penetrating into the assembly electrode 161$c$ and the electrode connection unit 213. To this end, the sealing part 212 should be disposed closer to the hole 210"" than the electrode connection unit 213.

The sealing part 212 is formed in a ring shape, and the material of the sealing part 212 is not specifically limited. The material constituting the sealing part 212 can be a known sealing material.

The electrode connection unit 213 is connected to the assembly electrode formed on the substrate to supply power to the assembly electrode. In an embodiment, the electrode connection unit 213 applies power supplied from the power supply unit 171 illustrated in FIG. 7 to the assembly electrode 161$c$ to form an electric field on the substrate.

On the other hand, the side wall part 210" is formed on the edge of the bottom part 210'. The side wall part 210" prevents fluid from penetrating into the opposite side of the assembly surface of the substrate during self-assembly. Specifically, the self-assembly device according to the present invention performs self-assembly in a state in which the substrate is immersed in the fluid. The side wall part 210" prevents the fluid from penetrating into the opposite surface of the assembly surface of the substrate when the substrate is immersed in the fluid.

To this end, the side wall part 210" is formed to surround the entire edge of the substrate. The height of the side wall part 210" should be greater than the depth at which the substrate is immersed in the fluid. The side wall part 210" prevents the fluid from penetrating into the opposite surface of the assembly surface of the substrate, thereby preventing the substrate from being damaged and allowing the buoyant force of the fluid to act only on one surface of the substrate. This will be described later.

Meanwhile, the second frame 220 serves to press the substrate from the opposite side of the first frame 210 during self-assembly. Like the first frame 210, the second frame 220 has a hole penetrating through the center portion. The hole formed in the second frame 220 is formed to be larger than or equal to the hole 210"" formed in the first frame 210.

The hole formed in the second frame 220 allows the opposite surface of the assembly surface of the substrate to be exposed to the outside. The opposite surface of the assembly surface of the substrate should be exposed to the outside with the same area as the assembly surface or a larger area than the assembly surface. This is because the magnetic field forming unit 300 forms a magnetic field on the opposite side of the assembly surface of the substrate. The opposite surface of the assembly surface of the substrate should be exposed to the outside so that the magnetic field forming part 300 can be sufficiently close to the substrate.

Meanwhile, the substrate S is loaded between the first and second frames 210 and 220 in the second state. Accordingly, the substrate S is loaded while sliding on one surface of the second frame 220. A protrusion for guiding an alignment position of the substrate can be formed on at least one of the first and second frames so that the substrate is aligned at a correct position. In an embodiment, referring to FIG. 13, a protrusion 211 for guiding an alignment position of the substrate S may be formed in the first frame 210.

On the other hand, when the substrate S is loaded on the second frame 220, at least one of the first and second frames 210 and 220 vertically moves so that the first and second frames 210 and 220 press the substrate. To this end, the substrate chuck 200 can include a frame moving part disposed on at least one of the fixing unit 230, the first frame, and the second frame 210 and 220. At this time, the sealing part 212 presses the substrate S.

In an embodiment, a frame moving part for vertically moving the second frame 220 can be disposed on the fixing unit 230. When the substrate S is loaded on the second frame 220 in the second state of the substrate chuck, the vertical moving part moves the second frame 220 upward so that the substrate S can be strongly fixed between the first and second frames 210 and 220. At this time, the electrode connection unit 213 provided in the first frame 210 is connected to the assembly electrode of the substrate S, and the sealing part 212 provided in the first frame 210 presses the edge of the substrate S. When the substrate chuck is switched to the first state in this state, a shape as shown in FIG. 14 is obtained.

However, the present invention is not limited thereto, and the frame moving part can be formed to horizontally move any one of the first and second frames 210 and 220 with respect to the other. In this case, the frame moving part is configured to vertically and horizontally move any one of the first and second frames 210 and 220 with respect to the other. When any one of the first and second frames 210 and 220 can be moved horizontally with respect to the other, the connection unit between the electrode connection unit 213 and the assembly electrode can be changed. This can be used to detect whether the assembly electrode is defective.

Meanwhile, the rotating part 240 is disposed on one side of the fixing part 230 provided in the above-described substrate chuck 200. The rotating part 240 rotates the fixing part 230 so that the first and second frames 210 and 220 can be in a vertical relationship. The substrate chuck 200 is switched from any one of the first and second states to the other by the rotational movement of the rotating part 240. The rotation speed, rotation degree, rotation direction, etc. of the rotation unit 240 can be controlled by the controller 172 described with reference to FIG. 7.

In the embodiment, the substrate chuck 200 is in the second state before loading the substrate S, after the substrate S is loaded, the controller 172 causes the rotating unit 240 to rotate the fixing unit 230 by 180 degrees so that the substrate chuck 200 is switched to the first state.

On the other hand, a vertical moving part and a horizontal moving part are arranged on one side of the fixing part 230.

The horizontal moving part moves at least one of the fixing unit 230 and the first and second frames 210 and 220 so that the assembly surface of the substrate can be aligned in the open position of the assembly chamber after loading the substrate.

The vertical moving part moves at least one of the fixing unit 230 and the first and second frames 210 and 220 so that the vertical distance between the substrate and the assembly chamber is adjusted. A warpage phenomenon of the substrate S can be corrected through the vertical movement unit. This will be described later.

In summary, the substrate S is loaded in the substrate chuck 200 in the second state (refer to FIG. 12). Thereafter, after the substrate chuck 200 is switched to the first state (refer to FIG. 11), it is aligned with the assembly chamber. In this process, the substrate chuck 200 moves vertically and horizontally so that the assembly surface of the substrate S comes into contact with the fluid filled in the assembly chamber. Thereafter, the controller 172 controls the magnetic field forming unit 300.

Next, the magnetic field forming unit 300 will be described.

FIG. 15 is a perspective view of a magnetic field forming unit according to an embodiment of the present invention, FIG. 16 is a side view of a magnetic field forming unit according to an embodiment of the present invention FIG. 17 is a lower side view of another magnetic field forming unit according to an embodiment of the present invention and FIG. 18 is a conceptual diagram illustrating the trajectories of magnets provided in the magnetic field forming unit according to the present invention.

Referring to the drawings, the magnetic field forming unit 300 includes a magnet array 310, a vertical moving part, a horizontal moving part, and a rotating unit 320. The magnetic field forming unit 300 is disposed above the assembly electrode to form a magnetic field.

Specifically, the magnet array 310 includes a plurality of magnets 313. The magnet 313 provided in the magnet array 310 can be a permanent magnet or an electromagnet. The magnets 313 form a magnetic field to guide the semiconductor light emitting devices to the assembly surface of the substrate.

The magnet array 310 can include a support part 311 and a magnet moving part 312. The support part 311 is connected to the vertical and horizontal movement part 320.

On the other hand, one end of the magnet moving part 312 is fixed to the support part 311, the other end of the magnet moving part 312 is fixed to the magnet (313). The magnet moving part 312 is made to be stretchable in length. As the magnet moving part 312 expands and contracts, the distance between the magnet 313 and the support part 311 changes.

As shown in the accompanying drawings, the magnet moving part 312 can be configured to vertically move the magnets 313 arranged in one row at a time. In this case, the magnet moving parts 312 can be arranged for each column of the magnet array.

Alternatively, the magnet moving part 312 can be disposed as many as the number of magnets provided in the magnet array. Accordingly, a distance between each of the plurality of magnets and the support part can be adjusted differently.

A plurality of magnet moving parts serve to fine-tune the distance between the magnet 313 and the substrate S, and when the substrate is bent, the plurality of magnet moving parts serves to uniformly adjust the distance between the magnets 313 and the substrate S. Self-assembly can be performed in a state in which the magnet 313 is in contact with the substrate S, or can be performed in a state in which the magnet 313 is spaced apart from the substrate S by a predetermined distance.

Meanwhile, the horizontal moving part can include a rotating unit. When self-assembly is performed, the horizontal moving part provided in the magnetic field forming unit 300 rotates the magnet while moving it in one direction. Accordingly, the magnet array 310 rotates about a predetermined rotation axis and moves along one direction at the same time. For example, referring to FIG. 18, the magnet 313 provided in the magnet array 310 can move while drawing a trajectory P in which a curved line and a straight line are mixed.

A semiconductor light emitting device can be supplied in a state in which the magnetic field forming unit 300 is close to the substrate S within a predetermined distance.

FIG. 19 is a conceptual diagram illustrating a state of supplying a semiconductor light emitting device.

Referring to FIG. 19, a chip supply unit 400 can be disposed in an assembly chamber 500 to be described later. The chip supply unit 400 aligns the substrate S in the assembly chamber 500 and serves to supply the semiconductor light emitting device on the assembly surface of the substrate S. Specifically, the chip supply unit 400 can include a chip receiving unit capable of accommodating a chip, a vertical moving part, and a horizontal moving part thereon. The vertical and horizontal moving parts allow the chip accommodating part to move in the fluid filled in the assembly chamber.

A plurality of semiconductor light emitting devices can be loaded in the chip accommodating part. After the substrate is aligned with the assembly chamber, when the magnetic field forming unit 300 is brought closer to the substrate by a predetermined distance or more, a magnetic field of a predetermined strength or more is formed on the assembly surface. In this state, when the chip accommodating part approaches the assembly surface within a predetermined distance, the semiconductor light emitting devices loaded in the chip accommodating part come into contact with the substrate. The vertical moving part provided in the chip supply unit moves the chip receiving unit close to a partial region of the assembly surface of the substrate within a predetermined distance through vertical movement.

After a predetermined time has elapsed, the vertical moving part provided in the chip supply unit moves the chip receiving unit away from a partial region of the assembly surface of the substrate by a predetermined distance or more through vertical movement. Thereafter, the horizontal moving part provided in the chip supply unit horizontally moves the chip receiving unit so that the chip receiving unit overlaps a partial region and another region of the assembly surface. Thereafter, the vertical moving part provided in the chip supply unit moves the chip receiving unit close to the other area within a predetermined distance through vertical movement. By repeating this process, the chip supply unit brings the plurality of semiconductor light emitting devices into contact with the entire area of the assembly surface of the substrate. The self-assembly can be performed in a state in which the plurality of semiconductor light emitting devices are uniformly dispersed and contacted over the entire area of the assembly surface of the substrate.

As described above, there are two major problems in self-assembly. As a second problem, since the semiconductor light emitting device cannot be completely uniformly dispersed in the fluid, and the magnetic field formed on the surface of the assembly substrate cannot be perfectly uniform, there is a problem in that the semiconductor light emitting device is concentrated only on a partial region of the assembly substrate. If the above-described chip supply unit 400 is used, the second problem described above can be solved.

However, the present invention is not limited thereto, and the chip supply unit is not an essential component of the present invention. The self-assembly can be performed in a state in which the semiconductor light emitting device is dispersed in a fluid, or in a state in which a plurality of semiconductor light emitting devices are dispersed and brought into contact with the assembly surface of the substrate by a part other than the chip supply unit.

Next, the assembly chamber 500 will be described.

FIG. 20 is a plan view of an assembly chamber according to an embodiment of the present invention, FIG. 21 is a cross-sectional view taken along line A-A' in FIG. 20, and FIGS. 22 and 23 are conceptual views illustrating movement of a gate provided in an assembly chamber according to an embodiment of the present invention.

The assembly chamber 500 has a space for accommodating a plurality of semiconductor light emitting devices. The space can be filled with a fluid, and the fluid can include water as an assembly solution. Accordingly, the assembly chamber 500 can be a water tank, and can be configured as an open type. However, the present invention is not limited thereto, and the assembly chamber 500 can be of a closed type in which the space is a closed space.

In the assembly chamber 500, the substrate S is disposed so that the assembly surface on which the semiconductor light emitting devices 150 are assembled faces downward. For example, the substrate S is transferred to the assembly position by the substrate chuck 200.

At this time, the assembly surface of the substrate S in the assembly position is directed toward the bottom of the assembly chamber (500). Accordingly, the assembling surface faces the direction of gravity. The assembly surface of the substrate S is disposed to be immersed in the fluid in the assembly chamber 500.

In an embodiment, the assembly chamber 500 can be divided into two regions. Specifically, the assembly chamber 500 can be divided into an assembly area 510 and an inspection area 520. In the assembly region 510, the semiconductor light emitting device disposed in the fluid is assembled into the substrate S while the substrate S is immersed in the fluid.

Meanwhile, in the inspection area 520, the self-assembly of the self-assembled substrate S is performed. Specifically, after the substrate S is assembled in the assembly area, it is transferred to the inspection area through the substrate chuck.

Both the assembly area 510 and the inspection area 520 can be filled with the same fluid. The substrate can be transferred from the assembly area to the inspection area while submerged in the fluid. When the substrate S disposed in the assembly region 510 is taken out of the fluid, the pre-assembled semiconductor light emitting device can be separated from the substrate due to surface energy between the fluid and the semiconductor light emitting device. For this reason, it is preferable that the substrate is transferred in a state immersed in the fluid.

In order to transfer the substrate in a state submerged in a fluid, the assembly chamber 500 can include a gate 530 configured to be movable up and down. As shown in FIG.

22, during self-assembly or substrate inspection, the gate 530 maintains an elevated state (a first state) to isolate the fluid contained in the assembly region 510 and the inspection region 520 of the assembly chamber 500 from each other. The gate 530 separates the assembly region and the inspection region, thereby preventing the semiconductor light emitting device from moving to the inspection region during self-assembly and interfering with the inspection of the substrate.

When the substrate S is transferred, as shown in FIG. 23, the gate 530 descends (second state) to remove the boundary between the assembly area 510 and the inspection area 520. Through this, the substrate chuck 200 can transfer the substrate from the assembly area 510 to the inspection area 520 only by horizontal movement without a separate vertical movement.

Meanwhile, a sonic generator for preventing aggregation of the semiconductor light emitting device can be disposed in the assembly region 510. The sonic generator can prevent a plurality of semiconductor light emitting devices from aggregating with each other through vibration.

Meanwhile, the bottom surfaces of the assembly area 510 and the inspection area 520 can be made of a light-transmitting material. In the embodiment, referring to FIG. 20, light transmitting areas 511 and 512 can be provided on the bottom surface of each of the assembly area 510 and the inspection area 520. Through this, the present invention makes it possible to monitor the substrate during self-assembly or perform an inspection on the substrate. Preferably, the area of the light transmission region is larger than the area of the assembly surface of the substrate. However, the present invention is not limited thereto, and the assembly chamber can be configured such that self-assembly and inspection are performed at the same location.

If the substrate chuck 200, the magnetic field forming unit 300, and the assembly chamber 500 described above are utilized, the self-assembly described with reference to FIGS. 8A to 8E can be performed. Hereinafter, a detailed structure and method for solving problems occurring during self-assembly will be described in detail.

First, the structure and method for solving the most core problems that occur during self-assembly will be described. To describe the problem in detail, as the area of the display increases, the area of the assembly substrate increases. As the area of the assembly substrate increases, the warpage phenomenon of the substrate increases. When self-assembly is performed in a bent state of the assembly substrate, since a magnetic field is not uniformly formed on the surface of the assembly substrate, it is difficult to stably perform self-assembly.

FIG. 24 is a conceptual diagram illustrating a substrate warpage phenomenon that occurs during self-assembly.

Referring to FIG. 24, when the substrate S is maintained in a flat state during self-assembly, the distance between the plurality of magnets 313 and the substrate S becomes uniform. In this case, the magnetic field can be uniformly formed on the assembly surface of the substrate. However, when the substrate is actually loaded into the substrate chuck 200, the substrate is bent due to gravity. In the bent state of the substrate (S'), the distance between the plurality of magnets 313 and the substrate (S') is not constant, making it difficult to uniformly self-assemble. Since the magnetic field forming unit is disposed on the upper side of the substrate, it is difficult to arrange a separate mechanism for correcting the warpage of the substrate on the upper side of the substrate. Also, when a separate mechanism for correcting the warpage of the substrate is disposed below the substrate, the movement of the semiconductor light emitting devices can be restricted, and a problem arises that the mechanism covers a part of the assembly surface. For this reason, it is difficult to arrange a mechanism for correcting the warpage of the substrate at either the upper side or the lower side of the substrate.

The present invention provides a structure and method of a substrate chuck for correcting the warpage of the substrate.

FIG. 25 is a conceptual diagram illustrating a method for correcting a warpage phenomenon of a substrate.

Referring to FIG. 25, after loading the substrate S' in the substrate chuck 200, when the assembly surface of the substrate faces the direction of gravity, the substrate S' is bent. In order to minimize the bending of the substrate when loading the substrate, at least one of the first and second frames 210 and 220 provided in the substrate chuck applies pressure to all four corners of the rectangular substrate. Nevertheless, when the area of the substrate S' increases, the substrate is inevitably bent due to gravity.

As shown in the second figure of FIG. 25, when the substrate chuck 200 moves to the assembly position and then descends a certain distance, the substrate S' comes into contact with the fluid F. In a state in which the substrate S' simply contacts the fluid F, the warpage of the substrate S' is not corrected. Although self-assembly can be made in the state shown in the second figure of FIG. 25, it is difficult to achieve uniform self-assembly.

The present invention further lowers the substrate chuck 200 while the substrate S' is in contact with the fluid F in order to correct the warpage of the substrate. At this time, the sealing part 212 provided in the first frame 210 prevents the fluid F from entering the window of the first frame. Also, the side wall part 210" provided in the first frame 210 prevents the fluid F from flowing over the first frame to the opposite surface of the assembly surface of the substrate S'.

Here, the sealing part 212 should be formed to surround all corners of the substrate. Also, the height of the side wall part 210" should be greater than the depth at which the first frame 210 descends to the maximum based on the state in which the first frame 210 is in contact with the fluid F. That is, when the substrate chuck 200 is lowered, the fluid should not penetrate beyond the window and the side wall part 210" of the first frame 210.

Due to the above-described sealing part 212 and sidewall part 210", when the substrate chuck 200 descends, the surface of the fluid F rises. At this time, the buoyancy force by the fluid F acts on the substrate S'. As the surface rise width of the fluid F increases, the buoyancy force acting on the substrate S' increases.

The present invention measures the degree of curvature of the substrate S' and adjusts the descending width of the substrate chuck 200 according to the degree of curvature of the substrate, so that the buoyancy force acting on the substrate varies. When an appropriate buoyancy force is applied to the substrate, as shown in the third figure of FIG. 25, the substrate maintains a flat state S.

The magnetic field forming unit 300 is transferred to the upper side of the substrate S in a state in which a buoyancy force is applied to the substrate S, and then horizontally moves along the substrate S. At this time, the power of the power supply unit 171 is applied to the assembly electrode 161c through the electrode connection unit 213. That is, the self-assembly proceeds in a state in which the buoyancy force is applied to the assembly surface of the substrate S.

As described above, it is possible to correct the warpage of the substrate without the need to dispose separate structures on the upper and lower sides of the substrate. Through this, the present invention makes it possible to achieve a high self-assembly yield even when the area of the assembly substrate increases.

The above-described chip tray serves to disperse the semiconductor light emitting devices on the surface of the assembly substrate before self-assembly. As described above, the chip tray moves horizontally and vertically with respect to the bottom surface of the assembly chamber, and supplies the semiconductor light emitting device to the surface of the assembly substrate. Here, as the area of the assembly substrate increases, there is a problem that the semiconductor light emitting device cannot be uniformly supplied.

Hereinafter, the above-mentioned problem will be described in detail.

FIG. 26 is a conceptual diagram showing the structure of a chip tray of related art, FIG. 27 is a partial cross-sectional view of a chip tray of related art and FIG. 28 is a conceptual diagram illustrating an aggregation form of the semiconductor light emitting device remaining in the chip tray when the semiconductor light emitting device is repeatedly supplied to the assembly substrate using the chip tray.

Referring to FIGS. 26 and 27, the chip tray of related art 400 includes a tray unit 410, a connection unit 420 and a transfer unit 430. The transfer unit 430 supplies the semiconductor light emitting devices supplied to the tray unit 410 to the assembly substrate.

Specifically, the tray unit 410 receives the semiconductor light emitting device from the chip supply device. The semiconductor light emitting devices supplied on the tray are in an aggregated form in a dome shape (or a central convex shape), and a plurality of dome shapes are formed at regular intervals. In the present specification, a dome-shaped agglomeration of the semiconductor light emitting devices on the tray unit 410 in a dome shape or a convex central shape is referred to as a dome-shaped agglomerate. The dome-shaped aggregate includes a plurality of semiconductor light emitting devices, and a plurality of dome-shaped aggregates are formed at predetermined intervals in the tray unit 410 immediately after receiving the semiconductor light emitting device from the chip supply device.

When the chip tray supplies the semiconductor light emitting device to the assembly substrate, some of the semiconductor light emitting devices included in each of the dome-shaped aggregates move to the assembly substrate. Hereinafter, as the tray unit 410 supplies the semiconductor light emitting device a plurality of times, it will be described what shape the dome-shaped aggregate changes.

Referring to FIG. 28, the dome-shaped aggregate c1 in the initial state becomes the concave shape c2 to c5 as the chip supply is performed a plurality of times. After receiving the semiconductor light emitting device from the chip supply device, since the tray unit 410 supplies the semiconductor light emitting devices to the assembly substrate without additional re-supply, the semiconductor light emitting devices are supplied to some regions of the assembly substrate in a state in which the semiconductor light emitting devices are aggregated in a concave shape. When the semiconductor light emitting device is supplied to the assembly substrate in a state in which the semiconductor light emitting device has a concave shape, the supply amount of the semiconductor light emitting device can be reduced.

To prevent this, whenever the chip tray disperses the semiconductor light emitting device on the assembly substrate, there may be a method of re-supplying the semiconductor light emitting device to the chip tray, but there is a problem in that the process time is very long.

The present invention provides a structure for improving the uniformity of the semiconductor light emitting devices supplied on the assembly substrate when the chip tray supplies the semiconductor light emitting devices on the assembly substrate a plurality of times.

Hereinafter, a chip tray according to the present invention will be described in detail.

FIG. 29 is a conceptual diagram showing the structure of the chip tray according to the present invention, FIG. 30 is a partial cross-sectional view of a chip tray according to the present invention and FIG. 31 is a conceptual diagram illustrating an aggregation form of the semiconductor light emitting device remaining in the chip tray when the semiconductor light emitting device is repeatedly supplied to an assembly substrate using the chip tray according to the present invention.

The chip tray 600 according to the present invention serves to supply the semiconductor light emitting device on the assembly surface of the assembly substrate. To this end, the chip tray 600 according to the present invention includes a tray unit 610, a chip alignment unit 620, and a transfer unit 630. The above-described components are disposed in the assembly chamber 500, and when the fluid is accommodated in the assembly chamber 500, at least a portion of the chip tray 600 is submerged in the fluid. Hereinafter, the above-described components will be described in detail.

Referring to the drawings, the tray unit 610 is made to accommodate the semiconductor light emitting device. Specifically, the tray unit 610 has a bottom part and a side wall part. The semiconductor light emitting devices can be accommodated in a space defined by the bottom part and the sidewall part. The tray unit 610 accommodates the semiconductor light emitting device in a state immersed in the fluid accommodated in the assembly chamber 500.

In the embodiment, a plurality of recessed part 611 can be formed in the bottom part provided in the tray unit 610. The plurality of recessed part 611 are formed at regular intervals in the bottom part, and semiconductor elements can be concentrated in the recessed part 611. Accordingly, a dome-shaped aggregate is formed in the recess 611.

Meanwhile, a chip alignment unit 620 can be disposed on one side of the tray unit 610. The chip alignment unit 620 serves to re-aggregate chips after the chip tray 620 supplies the semiconductor light emitting device to the assembly substrate. Specifically, a plurality of magnets 621 are disposed on the chip alignment unit 620. The magnets 621 are arranged at regular intervals. When the tray unit 610 approaches the chip alignment unit 620 within a predetermined distance, the semiconductor light emitting devices are aggregated to a position adjacent to the magnets 621.

In an embodiment, the magnets 621 provided in the chip alignment unit 620 are disposed at the same interval as the recessed part 611 provided in the tray unit 610, and can be disposed to overlap the recess 611. Accordingly, when the tray unit 610 is adjacent to the chip alignment unit 620, the semiconductor light emitting devices are aggregated in each of the recessed parts 611 provided in the tray unit 610. Thereafter, the tray unit 610 can re-supply the semiconductor light emitting devices to the assembly substrate in a state in which the semiconductor light emitting devices are aggregated. Specifically, referring to FIG. 31, immediately after the semiconductor light emitting devices are supplied to the tray unit 610, the semiconductor light emitting devices are aggregated in the same shape as d1. Thereafter, when the tray unit 610 supplies the semiconductor light emitting device to the assembly substrate, the center of the aggregate has a concave shape d2. Thereafter, when the tray unit 610 is adjacent to the chip alignment unit 620, the semiconductor light emitting devices are re-aggregated to have a shape like d3. While repeating this process, the volume of the aggregate is reduced little by little, but the semiconductor light emitting device can be supplied while the shape of the aggregate remaining in the tray unit 610 is maintained constant.

For this purpose, the movement of the tray unit 610 and the chip alignment unit 620 will be described. The chip tray 600 according to the present invention includes a transfer unit 630 for transferring the tray unit 610 and the chip alignment unit 620. The transfer unit 630 is configured to transfer the tray unit 610 and the chip alignment unit 620 horizontally and vertically with respect to the bottom surface of the assembly chamber.

The transfer unit 630 can be configured to transport the tray unit 610 horizontally and vertically with respect to the bottom surface of the assembly chamber 500, and to horizontally transport the chip alignment unit 620 with respect to the bottom surface of the assembly chamber 500. Specifically, the transfer unit 630 can be configured to transport the tray unit 610 and the chip alignment unit 620 together horizontally with respect to the bottom surface of the assembly chamber 500, and to move the tray unit 610 vertically with respect to the bottom surface of the assembly chamber 500 while the chip alignment unit 620 is fixed.

Hereinafter, after supplying the semiconductor light emitting device to the assembly substrate, and after re-aggregating the semiconductor light emitting devices accommodated in the tray unit 610, the movement of the transfer unit, the tray unit, and the chip alignment unit until the semiconductor light emitting device is re-supplied to the semiconductor light emitting device on the assembly substrate will be described.

First, in a state in which the assembly substrate is submerged in the fluid, the transfer unit 630 transfers the tray unit 610 accommodating the semiconductor light emitting device to the upper side so that the tray unit 610 approaches the assembly substrate within a predetermined distance. At this time, on the opposite side of the assembly surface of the assembly substrate, the magnet array 300 is close to within a predetermined distance.

As the tray unit 610 approaches the assembly substrate within a predetermined distance, a portion of the semiconductor light emitting device accommodated in the tray unit 610 moves to the assembly substrate. Accordingly, the aggregation form of the semiconductor light emitting devices aggregated in the tray unit 610 is changed. Specifically, immediately after supplying the semiconductor light emitting device to the assembly substrate, the semiconductor light emitting devices accommodated in the tray unit 610 are in a state in which the semiconductor light emitting devices are aggregated in a concave state.

Thereafter, the transfer unit 630 lowers the tray unit 610 to move away from the assembly substrate by a predetermined distance or more. At this time, since the chip alignment unit 620 is in a fixed state, as the tray unit 610 descends, the distance between the tray unit 610 and the chip alignment unit 620 becomes closer. As the tray unit 610 approaches the chip alignment unit 620, the semiconductor light emitting devices accommodated in the tray unit 610 are aggregated around magnets provided in the chip alignment unit 620.

Since the semiconductor light emitting device is excessively aggregated closer to the magnet, as the tray unit 610 approaches the chip alignment unit 620, the semiconductor light emitting devices accommodated in the tray unit 610 aggregate in a dome shape.

Thereafter, the transfer unit 630 transfers the tray unit 610 and the chip alignment unit 620 in a horizontal direction with respect to the bottom surface of the assembly chamber 500, so that the tray unit 610 overlaps with a partial region of the assembly substrate to which the semiconductor light emitting device is not supplied. Thereafter, the transfer unit 630 transports the tray unit 610 vertically with respect to the bottom surface of the assembly chamber 500 to supply the semiconductor light emitting device to the assembly substrate.

The transfer unit 630 repeats the above-described process until the semiconductor light emitting device is supplied to the entire assembly substrate. As described above, according to the present invention, the semiconductor light emitting device is supplied to the assembly substrate in an aggregated state in a convex shape. Through this, the present invention prevents the amount of semiconductor light emitting devices supplied from the chip tray to the assembly substrate from being reduced even if the number of times the chip tray supplies the semiconductor light emitting devices to the assembly substrate increases. Accordingly, according to the present invention, the semiconductor light emitting device can be uniformly supplied to the entire assembly substrate.

Hereinafter, the structure and connection relationship of the tray unit 610 and the chip alignment unit 620 and the transfer unit 630 described above will be described. The structure to be described below is an embodiment of the chip tray according to the present invention, and the structure of the chip tray according to the present invention is not limited to the structure to be described later.

FIG. 32 is a conceptual diagram illustrating a state in which the chip alignment unit and the transfer unit are connected, FIG. 33 is a conceptual diagram illustrating a state in which the tray unit and the transfer unit are connected, and FIGS. 34 and 35 are cross-sectional views of the tray unit and the chip aligner.

Referring back to FIG. 29, the transfer unit 630 includes x-axis transfer parts 631 and 632 and z-axis transfer parts 633 and 634.

The x-axis transfer parts 631 and 632 are fixed to the bottom or sidewall of the assembly chamber 500, and the z-axis transfer parts 633 and 634 are fixed on the x-axis transfer parts 631 and 632. The x-axis transfer parts 631 and 632 are configured to horizontally move with respect to the bottom surface of the assembly chamber 500. Since the x-axis transfer parts 631 and 632 utilize a known transfer means, a detailed description of the x-axis transfer parts 631 and 632 will be omitted.

The z-axis transfer parts 633 and 634 are fixed on the x-axis transfer parts 631 and 632. As the x-axis transfer parts 631 and 632 move horizontally, the z-axis transfer parts 633 and 634 also move together. In an embodiment, the x-axis transfer parts 631 and 632 include two transfer units (hereinafter, first and second x-axis transfer parts), each of the first and second x-axis transfer parts 631 and 632 is configured to fix both ends of the z-axis transfer part. Each of the first and second x-axis transfer parts 631 and 632 is fixed to both ends of the assembly chamber. Each of the first and second x-axis transfer parts 631 and 632 simultaneously moves along one direction while transferring the z-axis transfer parts 633 and 634 in one direction.

The z-axis transfer parts 633 and 634 can include two transfer parts (hereinafter, first and second z-axis transfer parts). Each of the first and second z-axis transfer parts 633 and 634 is fixed to the first and second x-axis transfer parts 631 and 632, respectively. A connection unit 640 is fixed to each of the first and second z-axis transfer parts 633 and 634.

The connection unit 640 connects the tray unit 610 and the chip alignment unit 620 and the z-axis transfer parts 633 and 634, and allows the tray unit 610 and the chip alignment unit 620 to move along the x-axis transporters 631 and 632 and the z-axis transporters 633 and 634.

The connection unit 640 is composed of two connection units (hereinafter, first and second connection units). Referring to FIG. 32, the first connection unit 641 can be fixed at a position 633" where no vertical movement of the z-axis transfer parts 633 and 634 occurs.

As described above, the chip alignment unit 620 only moves in a horizontal direction with respect to the bottom surface of the assembly chamber 500, but does not move in a vertical direction.

Meanwhile, referring to FIG. 33, the second connection unit 642 is fixed to a position 633' where the vertical movement of the z-axis transfer parts 633 and 634 occurs. As the first and second z-axis connectors 633 and 634 generate vertical movement, the second connection unit 642 moves perpendicular to the bottom surface of the assembly chamber 500. The second connection unit 642 is connected to the tray unit 610.

As described above, the tray unit 610 moves in horizontal and vertical directions with respect to the bottom surface of the assembly chamber 500.

Hereinafter, a method of supplying a semiconductor light emitting device using the chip tray 600 including the transfer unit 630 and the connection unit 640 described above will be described in detail.

First, in a state in which the assembly substrate S is submerged in the fluid, the first and second z-axis transfer parts 633 and 634 raise the second connection unit 642 upward with respect to the bottom surface of the assembly chamber 500, so that the tray unit 610 is brought close to the assembly substrate within a predetermined distance. Accordingly, the chip tray changes from the shape shown in FIG. 34 to the shape shown in FIG. 35. That is, the tray unit 610 is spaced apart from the chip alignment unit 620 by a predetermined distance (d). At this time, on the opposite side of the assembly surface of the assembly substrate, the magnet array 300 is close to within a predetermined distance.

As the tray unit 610 approaches the assembly substrate within a predetermined distance, a portion of the semiconductor light emitting device accommodated in the tray unit 610 moves to the assembly substrate. Accordingly, the aggregation form of the semiconductor light emitting devices aggregated in the tray unit 610 is changed. Specifically, immediately after supplying the semiconductor light emitting device to the assembly substrate, the semiconductor light emitting devices accommodated in the tray unit 610 are in a state in which the semiconductor light emitting devices are aggregated in a concave state.

Thereafter, the first and second z-axis transfer parts 633 and 634 lower the tray unit 610 to move away from the assembly substrate by a predetermined distance or more. At this time, since the chip alignment unit 620 is fixed at a position where the movement of the z-axis transfer parts 633 and 634 does not occur, even if vertical movement occurs in the z-axis transfer parts 633 and 634, the chip alignment unit 620 does not move. As the tray unit descends, the distance between the tray unit and the chip alignment unit becomes closer. Accordingly, the chip tray 600 becomes the shape shown in FIG. 34 from the shape shown in FIG. 35. As the tray unit 610 approaches the chip alignment unit 620, the semiconductor light emitting devices accommodated in the tray unit 610 are aggregated around magnets provided in the chip alignment unit 620.

The closer the position to the magnet, the more the semiconductor light emitting device aggregates, as the tray unit 610 approaches the chip alignment unit 620, the semiconductor light emitting devices accommodated in the tray unit 610 are aggregated in a convex shape.

Thereafter, the first and second x-axis transfer parts 631 and 632 transfer the first and second z-axis transfer parts 633 and 634 in a horizontal direction with respect to the bottom surface of the assembly chamber 500. Accordingly, the tray unit 610 and the chip alignment unit 620 are transferred in a horizontal direction with respect to the bottom surface of the assembly chamber. The first and second x-axis transfer parts 631 and 632 transfer the first and second z-axis transfer parts 633 and 634 until the tray unit 610 overlaps with a partial region of the assembly substrate to which semiconductor light emitting device is not supplied. Thereafter, the first and second z-axis transfer parts 633 and 634 transport the second connection unit 642 vertically with respect to the assembly substrate so that the tray unit 610 approaches the assembly substrate within a predetermined distance. Accordingly, the semiconductor light emitting devices accommodated in the tray unit 610 supply the semiconductor light emitting devices to the assembly substrate.

According to the present invention, even if the number of times the chip tray supplies the semiconductor light emitting device to the assembly substrate increases, the amount of the semiconductor light emitting device supplied from the chip tray to the assembly substrate is not reduced. Accordingly, according to the present invention, the semiconductor light emitting device can be uniformly supplied to the entire assembly substrate.

Meanwhile, in order to supply the semiconductor light emitting device to the assembly substrate in the above manner, the semiconductor light emitting device should be periodically supplied to the surface of the tray part, and the semiconductor light emitting device should be supplied at regular intervals and in a constant amount. Since the semiconductor light emitting device is supplied in a dispersed state in a fluid, it is difficult to supply a certain amount each time. The present invention provides a chip dispenser capable of supplying a semiconductor light emitting device on a chip tray in a predetermined amount and at a constant interval.

Hereinafter, a chip dispenser according to the present invention will be described in detail.

FIG. 36 is a cross-sectional view of the chip dispenser according to the present invention.

The chip dispenser 700 to be described below includes a body part 710, a nozzle part 720, a backflow prevention filter 730, stirring parts 741 and 742, a sealing part 750, a cover part 760, a chip leakage prevention part 770 and a pressure controller 780, but the chip dispenser according to the present invention can include more or fewer components than the above-described components.

The body part 710 accommodates a fluid and a semiconductor light emitting device. The fluid accommodated in the body part 710 can be the same fluid accommodated in the assembly chamber. The body part 710 can be formed in a shape that becomes narrower in the downward direction, but is not limited thereto.

A nozzle part 720 can be disposed at one end of the body part 710. The fluid accommodated in the body part 710 and the semiconductor light emitting device are discharged to the outside of the body part 710 through the nozzle part 720.

The shape of the inner wall surface of the nozzle part 720 can be implemented in various ways. For example, a screw thread or horizontal, vertical, or grid pattern can be formed on the inner wall surface of the nozzle part 720 to change the behavior of the fluid and the semiconductor light emitting device when the fluid and the semiconductor light emitting device are discharged.

On the other hand, the backflow prevention filter 730 can be disposed inside the body part 710. Specifically, the backflow prevention filter 730 should be disposed above the interface of the fluid formed in the body part 710. The backflow prevention filter 730 can prevent the fluid and the semiconductor light emitting device from flowing backward to the outside of the body part 710 due to the movement of the fluid generated by the stirring parts 741 and 742 to be described later. The backflow prevention filter 730 can include a material through which gas can freely pass, and through which the fluid and the semiconductor light emitting device are difficult to pass through. The material constituting the backflow prevention filter 730 is not specifically limited. When the backflow prevention filter 730 is made of a material through which gas cannot freely pass, the backflow prevention filter 730 may be damaged when the pressure controller 780, which will be described later, supplies gas into the body part 710.

Meanwhile, the stirring parts 741 and 742 can include at least one of an internal stirring part 741 and an external stirring part 742. The internal stirring part 741 is disposed inside the body part 710 and agitates the fluid accommodated in the body part 710.

In an embodiment, the internal stirring part 741 can be formed of a stirring stick and a rotating means for rotating the stirring stick. The rotating means is fixed to the inner wall of the body part 710, and allows a part of the stirring stick to rotate while being submerged in the fluid accommodated in the body part 710.

The internal stirring part 741 agitates the fluid and the semiconductor light emitting device accommodated in the body part 710 before the fluid and the semiconductor light emitting device accommodated in the body part 710 are discharged. Meanwhile, the internal stirring part 741 can agitate the fluid and the semiconductor light emitting device accommodated in the body part 710 while the fluid and the semiconductor light emitting device accommodated in the body part 710 are discharged.

On the other hand, the external stirring part 742 is disposed outside the body part 710. The external stirring part 742 is configured to horizontally or vertically move or rotate the entire body part 710. To this end, the external stirring part 742 can be formed of a known transfer means or rotation means. The external stirring part 742 may be fixed to the body part 710 or may be detachable from the body part 710.

As described above, the external stirring part 742 agitates the fluid in a state that does not come into contact with the fluid accommodated in the body part 710.

The internal and external stirring part 742 allows the semiconductor light emitting device to be discharged to the outside of the chip dispenser in a state uniformly dispersed in the fluid.

On the other hand, the cover part 760 is disposed on one side of the body part 710. The cover part 760 prevents the fluid and the semiconductor light emitting device accommodated in the body part 710 from escaping to the outside, and serves to prevent pressure loss during pressure control by the pressure controller 780, which will be described later.

The body part 710 and the cover part 760 can be coupled through a separate fastening means 761.

Meanwhile, a sealing part 750 can be disposed between the cover part 760 and the body part 710. The sealing part 750 prevents gas from moving between the body part 710 and the cover part 760. Through this, the sealing part 750 prevents pressure loss during pressure control by the pressure controller 780.

Next, the chip leak prevention part 770 prevents the semiconductor light emitting device from leaking through the nozzle part 720 at an undesired time. The chip leakage prevention part 770 includes at least one magnet.

On the other hand, the nozzle part 720 is provided with a magnet transfer unit for fixing the at least one magnet and transferring the at least one. The magnet transfer unit is configured to vary the distance between the at least one magnet and the nozzle part 720. The magnet transfer unit is fixed to any one of the body part 710 or the components constituting the chip dispenser according to the present invention, and moves along with the chip dispenser.

In an embodiment, the magnet transfer unit varies the horizontal distance between the at least one magnet and the nozzle part 720 while being fixed to the chip dispenser. Specifically, while the fluid and the semiconductor light emitting device are discharged through the nozzle part 720, the magnet transfer unit allows the at least one magnet to be spaced apart from the nozzle part 720 by a predetermined distance. On the other hand, in a state in which the fluid and the semiconductor light emitting device are not discharged through the nozzle part 720, the magnet transfer unit allows the at least one magnet to be positioned within a predetermined distance from the nozzle part 720.

Through this, the chip leak prevention part 770 can prevent the semiconductor light emitting device from being leaked to the outside of the chip dispenser except when the chip dispenser according to the present invention supplies the semiconductor light emitting device.

On the other hand, the pressure controller 780 is configured to pressurize or depressurize the inside of the body part 710. In an embodiment, the pressure controller 780 injects a predetermined volume of gas into the body part 710 to increase the pressure inside the body part 710. Through this, the pressure controller 780 discharges a predetermined volume of the fluid and the semiconductor light emitting device to the outside of the body part 710.

Here, the gas may be air, and the pressure controller 780 can inject the same volume of gas each time. Through this, the present invention allows always the same amount of fluid and semiconductor light emitting device to be discharged from the chip dispenser.

In summary, the stirring part agitates the fluid accommodated in the chip dispenser before or while the fluid and the semiconductor light emitting device are discharged from the chip dispenser. Through this, the present invention allows the semiconductor light emitting device to be uniformly dispersed in the fluid when the fluid and the semiconductor light emitting device are discharged from the chip dispenser. Meanwhile, the pressure controller 780 injects a predetermined volume of gas into the body part 710 so that a predetermined amount of fluid and the semiconductor light emitting device can be discharged. As described above, the chip dispenser can supply a predetermined amount of semiconductor light emitting devices on the chip tray.

Meanwhile, the chip tray according to the present invention has a structure for forming semiconductor light emitting devices at regular intervals on the chip tray.

FIG. 37 is a conceptual diagram showing a chip dispenser having a transfer unit.

The chip tray according to the present invention includes a transport unit capable of transporting the main body part 710 horizontally and vertically with respect to the chip tray.

In an embodiment, referring to FIG. 37, the chip dispenser according to the present invention includes a z-axis transfer part 810 that fixes the body part 710 and vertically transports the body part 710 with respect to the chip tray.

The z-axis transfer part 810 is fixed to the y-axis transfer part 820. The y-axis transfer part 820 transfers the z-axis transfer part 810 in a horizontal direction with respect to the chip tray. Meanwhile, the y-axis transfer part 820 is fixed on the x-axis transfer part 830. The x-axis transfer part 830 transports the y-axis transfer part 820 in a direction perpendicular to the movement direction of the y-axis transfer part 820. Through this, the body part 710 is transported horizontally and vertically with respect to the chip tray.

The transfer unit supplies the semiconductor light emitting device to one area on the chip tray, and then transfers the body part 710 to another area on the chip tray. Thereafter, the pressure controller 780 controls the internal pressure of the body part 710 to discharge the fluid and the semiconductor light emitting device. The transfer unit transfers the body part 710 at regular intervals so that the semiconductor light emitting devices are supplied to the chip tray at regular intervals.

On the other hand, the chip dispenser according to the present invention can include a plurality of body parts 710. Each of the plurality of body parts 710 may be fixed to each of the plurality of z-axis transfer parts 810, and each of the plurality of z-axis transfer parts 810 may be fixed to the y-axis transfer part 820. By utilizing the plurality of body parts 710, it is possible to supply the semiconductor light emitting device to several locations at once. Through this, according to the present invention, it is possible to shorten the time for supplying the semiconductor light emitting device on the chip tray.

As described above, according to the present invention, since it is possible to supply a certain amount of the fluid in which the semiconductor light emitting device is uniformly dispersed, it is possible to supply a certain amount of the semiconductor light emitting device on the chip tray. Also, according to the present invention, since the supply position of the semiconductor light emitting device can be freely adjusted, it is possible to supply the semiconductor light emitting device at regular intervals on the chip tray.

The invention claimed is:

1. A chip dispenser for a self-assembly device comprising:
  a body part configured to accommodate a fluid and a semiconductor light emitting device inside the body part, and discharge the fluid and the semiconductor light emitting device, wherein the fluid is an assembly solution;
  a pressure controller configured to vary a pressure inside the body part;
  a stirring part including an internal stirring part disposed in an inside of the body part and configured to agitate the fluid and the semiconductor light emitting device accommodated in the body part, and an external stirring part configured to horizontally and vertically move or rotate the body part;
  a nozzle part disposed at one end of the body part and configured to discharge the fluid and the semiconductor light emitting device accommodated in the body part to an outside of the body part; and
  a chip leakage prevention part having at least one magnet and a magnet transfer unit configured to vary a distance between the at least one magnet and the nozzle part, wherein the magnet transfer unit is fixed to the body part,
  wherein the pressure controller is configured to increase the pressure inside the body part so that the fluid and the semiconductor light emitting device are discharged to the outside while the stirring part stirs the fluid and the semiconductor light emitting device.

2. The chip dispenser according to claim 1, wherein the pressure controller is configured to inject a predetermined volume of gas into the body part while the pressure inside of the body part increases.

3. The chip dispenser according to claim 1, wherein the magnet transfer unit separates the at least one magnet from the nozzle part by a predetermined distance so that the fluid and the semiconductor light emitting device are discharged to the outside in a state in which the at least one magnet is spaced apart from the nozzle part by a predetermined distance, and transfers the at least one magnet so that the at least one magnet is positioned within a predetermined distance from the nozzle part in a state when the fluid and the semiconductor light emitting device are not discharged to the outside.

4. The chip dispenser according to claim 1, further comprising a backflow prevention filter disposed inside the body part to block a backflow of the fluid and the semiconductor light emitting device to the pressure controller.

5. The chip dispenser according to claim 4, wherein the backflow prevention filter is permeable to a gas.

6. The chip dispenser according to claim 1, wherein the stirring part is configured to stir the fluid while at least a portion of the internal stirring part is submerged in the fluid.

7. The chip dispenser according to claim 1, further comprising a transfer unit configured to transfer the body part in horizontal and vertical directions.

8. The chip dispenser according to claim 1, wherein the chip leakage prevention part is configured to prevent the semiconductor light emitting device from being discharged to the outside, except at a time of discharging the semiconductor light emitting device.

9. The chip dispenser according to claim 4, wherein the backflow prevention filter is disposed above an interface of the fluid accommodated in the body part.

10. The chip dispenser according to claim 6, wherein the internal stirring part stirs the fluid accommodated in the body part and the semiconductor light emitting device even while the fluid and the semiconductor light emitting device accommodated in the body part are discharged.

11. The chip dispenser according to claim 1, wherein the external stirring part is fixed to the body part or detachable from the body part.

12. The chip dispenser according to claim 7, wherein the transfer unit comprises an x-axis transfer part, a y-axis transfer part, and a z-axis transfer part, and
  wherein the y-axis transfer part is fixed to the x-axis transfer part, and the x-axis transfer part transfers the y-axis transfer part perpendicular to a transfer direction of the y-axis transfer part.

13. The chip dispenser according to claim 12, wherein the body part comprises a plurality of body parts, the z-axis transfer part comprises a plurality of z-axis transfer parts, and the plurality of body parts are respectively fixed to the plurality of z-axis transfer parts.

14. The chip dispenser according to claim 1, wherein the body part has a shape that becomes narrower in a downward direction.

15. The chip dispenser according to claim 1, wherein an inner wall surface of the nozzle part comprises a thread or a horizontal, vertical, or grid pattern.

16. The chip dispenser according to claim 1, further comprising a cover part disposed on an upper side of the body part.

17. The chip dispenser according to claim 16, further comprising a sealing part disposed between the cover part and the body part.

* * * * *